United States Patent
Grenouillet et al.

(10) Patent No.: US 9,841,657 B2
(45) Date of Patent: Dec. 12, 2017

(54) CMOS PHOTONIC INVERTER

(71) Applicant: Commissariat A l'Energie Atomique et aux Energies Alternatives, Paris (FR)

(72) Inventors: Laurent Grenouillet, Grenoble (FR); Olivier Rozeau, Moirans (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 229 days.

(21) Appl. No.: 14/719,580

(22) Filed: May 22, 2015

(65) Prior Publication Data
US 2015/0338720 A1  Nov. 26, 2015

(30) Foreign Application Priority Data
May 23, 2014 (FR) .................................. 14 54686

(51) Int. Cl.
| H01L 27/146 | (2006.01) |
|---|---|
| G02F 3/02 | (2006.01) |
| H01L 27/092 | (2006.01) |
| H01L 27/12 | (2006.01) |
| H01L 27/144 | (2006.01) |
| H01L 29/78 | (2006.01) |

(52) U.S. Cl.
CPC .............. *G02F 3/02* (2013.01); *H01L 27/092* (2013.01); *H01L 27/1203* (2013.01); *H01L 27/1446* (2013.01); *H01L 29/785* (2013.01)

(58) Field of Classification Search
CPC .............. H01L 29/785; H01L 27/1446; H01L 27/1203; G02F 3/02

USPC .......................................................... 257/444
See application file for complete search history.

(56) References Cited

U.S. PATENT DOCUMENTS

| 4,954,895 A | 9/1990 | Akimoto et al. |
|---|---|---|
| 7,875,958 B2* | 1/2011 | Cheng .................... B82Y 10/00 257/190 |
| 2004/0179391 A1* | 9/2004 | Bhattacharyya .. H01L 21/28194 365/149 |
| 2006/0108611 A1* | 5/2006 | Seitz ......................... G01J 9/00 257/222 |
| 2009/0003105 A1* | 1/2009 | Itoh ..................... G11C 11/4091 365/203 |
| 2009/0294822 A1 | 12/2009 | Batude et al. |
| 2013/0049117 A1 | 2/2013 | Zhu et al. |
| 2015/0056734 A1 | 2/2015 | Grenouillet et al. |

FOREIGN PATENT DOCUMENTS

| EP | 1 976 012 A2 | 10/2008 |
|---|---|---|
| EP | 2 587 539 A1 | 5/2013 |
| WO | WO 03/102510 A2 | 12/2003 |

OTHER PUBLICATIONS

U.S. Appl. No. 14/791,713, filed Jul. 6, 2015, Reboh, et al.
(Continued)

*Primary Examiner* — Jami M Valentine
(74) *Attorney, Agent, or Firm* — Oblon, McClelland, Maier & Neustadt, L.L.P.

(57) ABSTRACT

Photosensitive logic inverter, in particular of the CMOS type, formed of a transistor of type P and of a transistor of type N of which the respective threshold voltages can be modulated according to the quantity of photons received by a photosensitive zone provided opposite these transistors.

21 Claims, 16 Drawing Sheets

(56) References Cited

OTHER PUBLICATIONS

U.S. Appl. No. 14/425,891, filed Mar. 4, 2015, Laurent Grenouillet et al.
French Preliminary Search Report dated Jan. 12, 2015 in French Application 14 54686, filed on May 23, 2014 (with English Translation of Categories of Cited Documents).
R. Tsuchiya et al. "Silicon on Thin Box: A New Paradigm of the CMOSFET for Low-Power and High-Performance Application Featuring Wide-Range Back-Bias Control", Electron Devices Meeting, 2004, 4 pages.

* cited by examiner

CMOS PHOTONIC INVERTER

TECHNICAL FIELD AND PRIOR ART

This invention relates to the field of photosensitive devices and relates to the implementation of a photosensitive logic cell also referred to as photonic logic inverter.

In the technical field of photosensitive devices, document EP 2°587°539 presents a microelectronic device formed from a transistor fabricated on a substrate of the semiconductor on insulator type, the transistor having a threshold voltage that can be modulated according to a quantity of photons received by a photosensitive zone located in the semiconductor support layer of the substrate, the photosensitive zone being separated from the channel zone of the transistor through the insulating layer of the substrate. The threshold voltage variation of the transistor is allowed thanks to the establishing of a capacitive coupling between the photosensitive zone and the channel zone of the transistor. As such, when there is no light radiation to be detected, the threshold voltage of the transistor is equal to a value $Vt_1$, while when there is a light radiation to be detected, the threshold voltage of the transistor is equal to a value $Vt_2$ different from $Vt_1$.

Using such a device, it can be sought to implement a binary detection mode of light radiation.

The problem arises of implementing a new photosensitive device able to carry out a detection of light radiation and to able to translate this detection in the form of a digital signal, the whole in a limited space.

DISCLOSURE OF THE INVENTION

This invention first relates to a photosensitive logic cell comprising: a first transistor of the P type and a second transistor of the N type based on semiconductor substrate on insulator, with the substrate comprising a semiconductor surface area comprising a channel zone of the first transistor and a channel zone of said second transistor, an insulating layer separating the semiconductor surface area from a semiconductor support layer, the semiconductor support layer comprising at least one photosensitive zone configured to convert photons into charge carriers and comprising a first junction arranged opposite the channel zone of said first transistor and a second junction arranged opposite the channel zone of said second transistor, with the insulating layer being configured in such a way as to allow for a capacitive coupling between the photosensitive zone and the thin semiconductor layer, in such a way that the first transistor and the second transistor respectively have a first threshold voltage and a second threshold voltage that can be modulated according to a quantity of photons received by the photosensitive zone.

The first transistor and the second transistor are arranged according to a logic inverter configuration, in particular a CMOS logic inverter configuration.

As such, the first transistor can be provided with a gate connected to that of the second transistor, while the drain of the first transistor is connected to the drain of the second transistor.

According to a first possibility of implementing the photosensitive logic cell, the input signal that varies the output state of the logic cell is a luminous signal.

According to the first possibility of implementing the photosensitive logic cell, the latter can be configured in such a way as to deliver as output a logic signal $V_{OUT}$ having a first logic state when the photosensitive zone is subjected to a first illumination, for example little or no illumination, and in order to deliver as output a logic signal $V_{OUT}$ having a second logic state, when the photosensitive zone is subjected to a second illumination, higher than the first illumination.

According to this first possibility of implementing, the first junction and the second junction may each be provided with a P-doped lower zone surmounted by an N-doped upper zone.

Alternatively, the first junction and the second junction each comprise an N-doped zone surmounted by a P-doped upper zone.

According to the first possibility of implementing the cell, the latter can also comprise an input set to a predetermined fixed polarization potential $V_{NP}$ or $V_{PN}$ which is applied to the gates of the first and of the second transistor, with the first transistor and the second transistor being biased in such a way as to have constant respective gate-source voltages.

A photosensitive logic cell of which the logic state of its output depends solely on the quantity of photons received can as such be realized advantageously.

The first junction can advantageously be polarized independently of the second junction.

Means for applying a first polarization potential on the first junction and means for applying a second polarization potential different from the first potential on the second junction can as such be provided. In this case, for the same change in illumination state between the first junction and the second junction, a threshold voltage modulation of the first transistor different from that implemented for the second transistor can advantageously be implemented.

In order to carry out an electrical isolation between the first junction and the second junction, the cell can further comprise at least one isolating trench between the first transistor and the second transistor, with the isolating trench passing through the support layer.

Means of polarization can be provided and configured to apply a determined polarization potential Vpol to the lower zone of the first junction and/or of the second junction, with the upper zone of the first junction and/or of the second junction then being set to a floating potential.

According to a second possibility of implementing the photosensitive logic cell, the input signal that varies the output state of the logic cell is a logic signal of an electrical nature.

For this alternative implementation, the switching speed from one logic state to another at the output of the cell depends on the illumination state of the cell.

A second possibility of implementing the photosensitive logic cell, provides as such a means for applying a variable potential $V_{IN}$ as input of the inverter.

In this case, a photosensitive logic inverter can as such be carried out advantageously of which the logic state of its output depends on the potential $V_{IN}$ as input, as for a conventional logic inverter, but of which the transition speed of its output between two logic states depends on the quantity of photons received by the latter, and in particular whether or not the photosensitive zone is exposed to a light radiation.

According to this second possibility of implementing the photosensitive logic cell, the arrangement of the junctions can be such that the first junction comprises an N-doped lower zone surmounted by a P-doped upper zone, with the second junction comprising a P-doped lower zone surmounted by an N-doped upper zone. Alternatively, the first junction comprises a P-doped lower zone surmounted by an N-doped upper zone, with the second junction comprising an N-doped lower zone surmounted by a P-doped upper zone. The first junction and the second junction are as such oriented in different directions.

According to a possibility of implementing the photosensitive logic cell, an isolating zone can be provided around the first transistor and/or the second transistor.

This isolating zone can pass through the support layer and be configured in such a way as to electrically isolate said cell, in particular its photosensitive zone, from another cell or another element formed in the substrate.

The photosensitive logic cell can be integrated into a device comprising one or several other transistors of which the threshold voltage does not vary or varies little according to the illumination of the device. These other transistors can be for example transistors of a signal processing circuit connected to the photosensitive logic cell.

According to a possibility of implementing, these other transistors can be formed opposite a ground plane made in the semiconductor support layer.

According to a possibility of implementing, the photosensitive logic cell can be integrated into a device of which the components are distributed over several levels and further comprising at least one other transistor arranged in such a way that the logic cell and this other transistor are superimposed.

According to a possibility of implementing the photosensitive logic cell, the transistors can be carried out according to a technology of the FDSOI or UTBB-FDSOI type.

This invention further relates to a logic circuit for carrying out a determined logic function such as a NOT AND or NOT OR function, with this circuit comprising a photosensitive logic cell such as defined hereinabove.

This invention also relates to a SRAM (for "Static Random Access Memory") memory cell of which the flip-flop is formed of a photosensitive logic cell such as defined hereinabove.

This invention also relates to a photosensitive logic circuit comprising a plurality of cells such as defined hereinabove.

This invention also relates to a photosensitive logic circuit creating a given logic function and provided with one or several photosensitive logic cells such as defined hereinabove, with the logic function, such as a collective programming or reset function, able to be modified according to the illumination of the device.

According to an embodiment, this invention provides a device comprising:

one or several cells such as defined hereinabove and provided with junctions each formed from an N-doped zone surmounted by a P-doped upper zone or by a P-doped zone surmounted by an N-doped upper zone and a polarization control circuit configured to apply a voltage step to the first transistor and to the second transistor and place the cell in an erased or reset state.

Such a voltage step can make it possible to discharge regions located at the interface between the insulating layer of the substrate and respectively the first and the second junction.

BRIEF DESCRIPTION OF THE DRAWINGS

This invention shall be better understood when reading the description of given embodiments, purely for the purposes of information and in no way restrictive, in reference to the annexed drawings wherein:

FIGS. 2A-2B show a first example of a configuration of a photosensitive logic inverter formed using the cell of FIG. 1, for which the logic state of the output of the inverter depends on a quantity of photons received by the latter, while

FIGS. 3A-3B show a second example of a configuration of a photosensitive logic inverter according to the invention for which the logic state of the output of the inverter also depends on the illumination level of the latter, while

FIGS. 4A-4B show a third example of a photosensitive logic inverter configuration according to the invention for which the logic state of the output of the inverter depends on that of its input, and for which the switching speed from one logic state to another at the output of the inverter depends on the illumination level of the latter, while

FIGS. 5A-5B show a fourth example of a photosensitive logic inverter configuration according to the invention, while

Identical, similar or equivalent portions of the different figures bear the same numerical references so as the facilitate passing from one figure to another.

The various parts shown in the figures are not necessarily shown to a uniform scale, in order to make the figures more legible.

DETAILED EXPOSURE OF PARTICULAR EMBODIMENTS

Figure 1A:
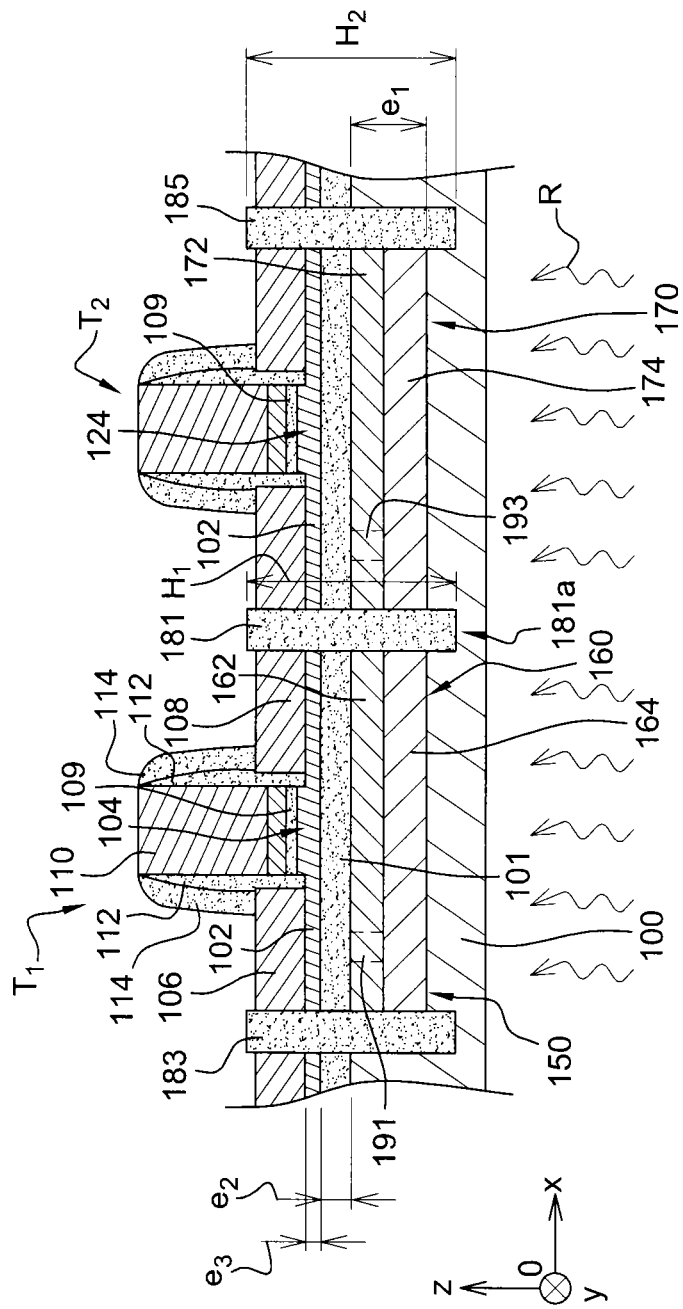
FIGS. 1A-1C show an example of structure of a photosensitive logic cell implemented according to the invention and comprising a first transistor and a second transistor of different types arranged opposite a photosensitive zone, with this zone comprising a first junction and a second junction coupled by capacitive coupling respectively to the channel of the first transistor and to the channel of the second transistor.

An example of a structure of a photosensitive logic cell, implemented according to the invention, is given in FIG. 1A.

This cell comprises a first transistor $T_1$ of a first type, for example of type P as well as a second transistor $T_2$ of a second type, for example of type N, which are juxtaposed and formed on a substrate of the semiconductor on insulator type, for example of the SOI type (SOI for "Silicon on Insulator").

The substrate comprises a semiconductor support layer 100, an isolating layer 101 disposed on a face referred to as "front face" of the support layer 100, and a semiconductor surface layer 102 disposed on the insulating layer 101 and wherein the channel of the first transistor $T_1$ and of second transistor $T_2$ are provided.

The transistors $T_1$ and $T_2$ can be MOS transistors (MOS for "Metal Oxide Semi-conductor") carried out for example according to a technology of the SOI type that is fully depleted with thin buried oxide, called UTBB-FDSOI (for "Ultra-Thin Body and Box"-"Fully Depleted Silicon On Insulator").

The semiconductor surface layer 102 has a thickness $e_3$ (measured in a direction parallel to an axis z with a marking [O; x; y; z]) which can be for example between 4 and 30 nm, more preferably between 6 and 12 nm.

The support layer 100 is configured in such a way as to comprise a photosensitive zone 150 which extends opposite the first transistor $T_1$ and the second transistor $T_2$, with this photosensitive zone 150 being intended to receive a light radiation R, which can penetrate for example in part via a rear face of the support layer 100 opposite its front face.

This photosensitive zone 150 comprises a first junction 160, for example a junction of type PN opposite the first transistor $T_1$, and a second junction 170 for example a junction of type PN opposite the second transistor $T_2$.

The junctions 160, 170, can have a height also called thickness $e_1$ (measured parallel to the axis z of marking [0; x; y; z]) between for example 100 nm and 5 μm.

The first junction 160 and the second junction 170 each comprise a first doped zone 162, 172 according to a doping of a first type, for example of type N, and a second zone 164, 174 doped according to a doping of a second type, for example of type P, with the first zone and the second zone being superimposed.

In the example of the structure of the logic cell given in FIG. 1, the arrangement of the doped zones 162, 164 forming the first junction 160 is such that the first N-doped zone 162 is arranged between the channel zone 104 of the first transistor $T_1$ and the second P-doped zone 164. The arrangement of the doped zones 172, 174 forming the second junction 170 is such that the first N-doped zone 172 is arranged between the channel zone 124 of the second transistor $T_2$ and the second P-doped zone 174.

As such, the second P-doped zones 164, 174 are in this example lower zones of the junctions located on the side of the rear face of the support layer 100, while the first N-doped zones 162, 172 are upper zones of the junctions located on the side of the front face of the support layer 100.

The photosensitive zone 150 can be arranged in the support layer 100 in such a way as to be adjacent to the insulating layer 101 in such a way that the upper doped zones 162, 172 of the junctions 160, 170 are in contact with the insulating layer 101.

The thickness $e_2$ of this isolating layer 101 is chosen to be sufficiently low so that a photo-generated voltage on the side of its rear face can induce a corresponding voltage via capacitive coupling of the side of its front face.

The photosensitive zone 150 and the channel zone 104 of the first transistor $T_1$ are as such separated by the intermediary of the insulating layer 101, of which the configuration, in particular its composition and its thickness $e_2$, are provided in such a way as to allow for the establishing of a capacitive coupling between the first junction 160 and the channel zone 104 of the first transistor.

In order to allow for such a coupling, the insulating layer 101 can be for example with a $SiO_2$ base and have a thickness $e_2$ which can be between for example 5 nm and 50 nm, more preferably between 10 and 25 nm. The capacitive coupling is such that a variation in the potential consecutive to the receiving of a light radiation on the photosensitive zone, and in particular on the first junction 160 can induce a variation $LIVS_P$ (with "LIVS" for "Light Induced $V_{TP}$ Shift" or a shift in the threshold voltage $V_{TP}$ induced by light, with this shift being noted as $LIVS_P$ for a transistor of type P) of the threshold voltage $V_{TP}$ of the first transistor $T_1$. Likewise, the photosensitive zone 150 and a channel zone 124 of the second transistor $T_2$ are separated by the intermediary of the insulating layer 101, configured in such a way that a capacitive coupling between the photosensitive zone 150 and the channel zone is able to be established and to make it possible to induce a variation noted as $LIVS_N$ of the threshold voltage $V_{TN}$ of the second transistor $T_2$ consecutively to the receiving of a light radiation on the photosensitive zone 150, and in particular on the second junction 160.

The threshold voltage variation $V_{TP}$ of the first transistor $T_1$, and/or of that $V_{TN}$ of the second transistor $T_2$, consecutive to an illumination or a variation in the illumination of the photosensitive zone can for example reach a value of about 100 mV and even 350 mV or even 500 mV.

By adapting the respective thicknesses $e_2$ of the insulating layer 101, and/or $e_3$ of the semiconductor surface area 102, and/or of the gate dielectric of the transistors the threshold voltage shift can be adjusted.

A decrease in the thickness of the insulating layer 101, and/or an increase in the thickness $e_3$ of the semiconductor surface area 102, and/or an increase in the thickness of the gate dielectric of the transistors are in particular favorable for an increase in this shift of threshold voltage.

An isolating trench 181, for example of type STI (STI for "shallow trench isolation") is arranged between the first transistor $T_1$ and the second transistor $T_2$ and configured in such a way as to carry out an electrical isolation between the first junction 160 and the second junction 170. This trench is filled with a dielectric material such as for example $SiO_2$. The isolation can be such that when a photon is absorbed by the photosensitive zone 150 on one of the first junction 160 or second junction 170, the latter does not affect the other junction, i.e. it does not induce the creation of a charge carrier in this other junction. The trench 181 can have a height $H_1$ provided for example between 50 nm and 3 μm and can comprise an end 181a arranged in the support layer 100 and which exceeds in relation to the lower doped zone of the junctions 160, 170. A polarization of the first junction 160 totally independent of that of the second junction 170, i.e. with different polarization potentials can as such be provided possibly.

One or several other isolating trenches 183, 185 for example of type STI can also be arranged around the first transistor $T_1$ and of the second transistor $T_2$. These other isolating trenches 183, 185 which can also be filled with dielectric material such as for example $SiO_2$, are configured in such a way as to carry out an electrical isolation between the logic cell and an exterior element also carried out on the substrate, for example another photosensitive logic cell or another element. The trench or trenches 183, 185 arranged around transistors $T_1$, $T_2$ are arranged in such a way that a photon absorbed on the photosensitive zone 150 of the logic cell does not affect another photosensitive zone of an adjacent logic cell (not shown). The trenches 183, 185 can have a height $H_2$ which can be provided to be higher than that $H_1$ of the isolating trench 181, and for example such that they exceed in the support layer 100 under the insulating layer 101 by a distance for example of about 200 nm.

In order to make it possible to polarize the first junction 160 and the second junction 170, one or several conductive elements 191, 193, passing through the semiconductor surface area 102, the insulating layer 101 and a portion of the support layer 100 can be provided. A connection of the conductive elements 191, 193 to the lower doped zones 164, 174 can be established without however carrying out a connection with the upper doped zones 162, 172. For this, the conductive elements 191, 193 can be in contact with regions of the lower doped zones 164, 174 which extend in a plan parallel to the main plane of the substrate (i.e. a plane parallel to the plane [O; x; y] in FIG. 1) beyond the upper doped zones 162, 172 and exceed these zones.

The first transistor $T_1$ and the second transistor $T_2$ also comprise zones of source and of drain which can be formed at least partially of semiconductor blocks 106, 108 arranged on the semiconductor surface area 102.

The first transistor $T_1$ and the second transistor $T_2$ each also comprise a gate block 110 of which the lateral flanks can be covered on either side of the isolating zones forming first spacers 112. The first spacers 112 are partially buried in the respective active zones of transistors $T_1$, $T_2$ while other isolating zones forming second spacers 114, are based on respective active zones of transistors $T_1$, $T_2$ and are arranged against the first spacers 112.

The respective gate blocks 110 of transistors $T_1$, $T_2$ are arranged on gate dielectric zones 109, for example with a $SiO_2$ base and of the thick gate oxide (or GO2) type or of a "high-k" material such as $HfO_2$. The gate dielectric zone 109 can have an electrical thickness in Tinv inversion for example between 0.7 nm and 7 nm, more preferably between 1.5 nm and 4 nm.

Figure 1B:
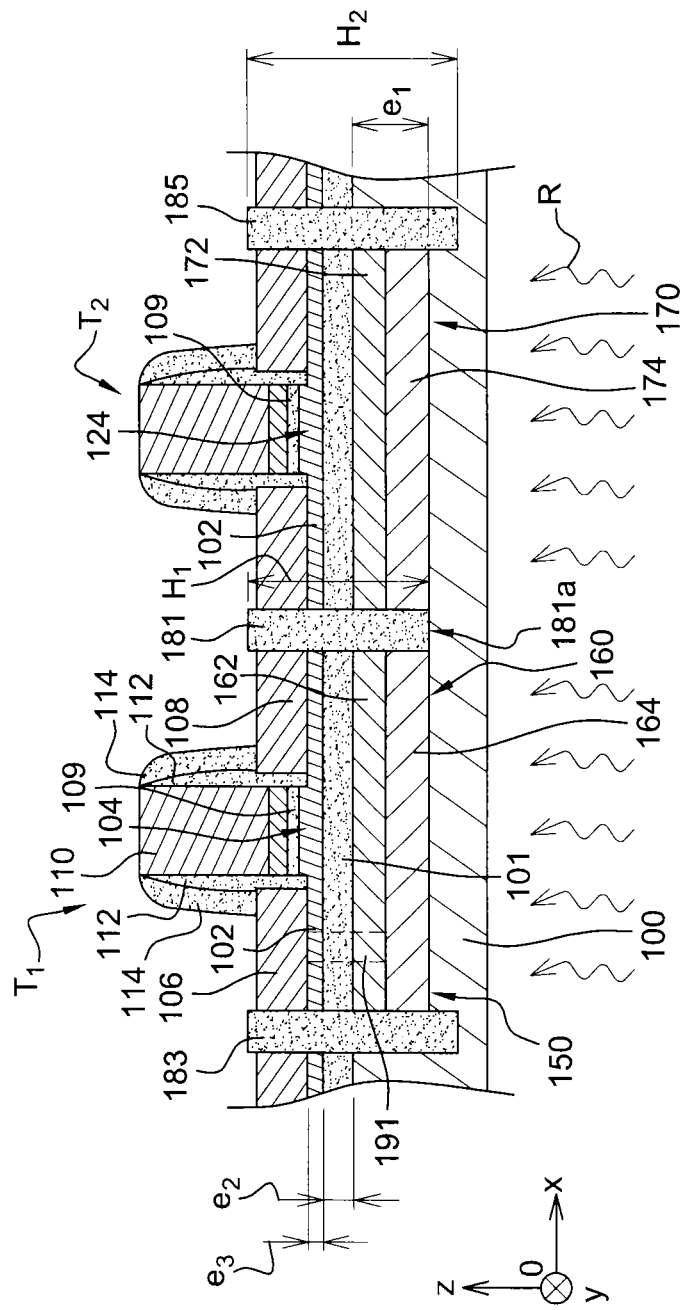

An alternative of the cell of FIG. 1A is given in FIG. 1B. The isolating trench 181 arranged between the junctions 160, 170 is such a way as to carry out a separation between the doped zones 162, 172 is this time provided with a height $H_1$ such that the lower portion of the isolating trench 181 is elevated in relation to lower doped zones 164, 174 of the junctions 160, 170, with these lower doped zones being in contact with each other and able this time to be set at the same polarization potential, more preferably not floating for example by the intermediary of a conductive element 191 to which a fixed voltage is applied. This can then make it possible to make the polarization easier.

Figure 1C:
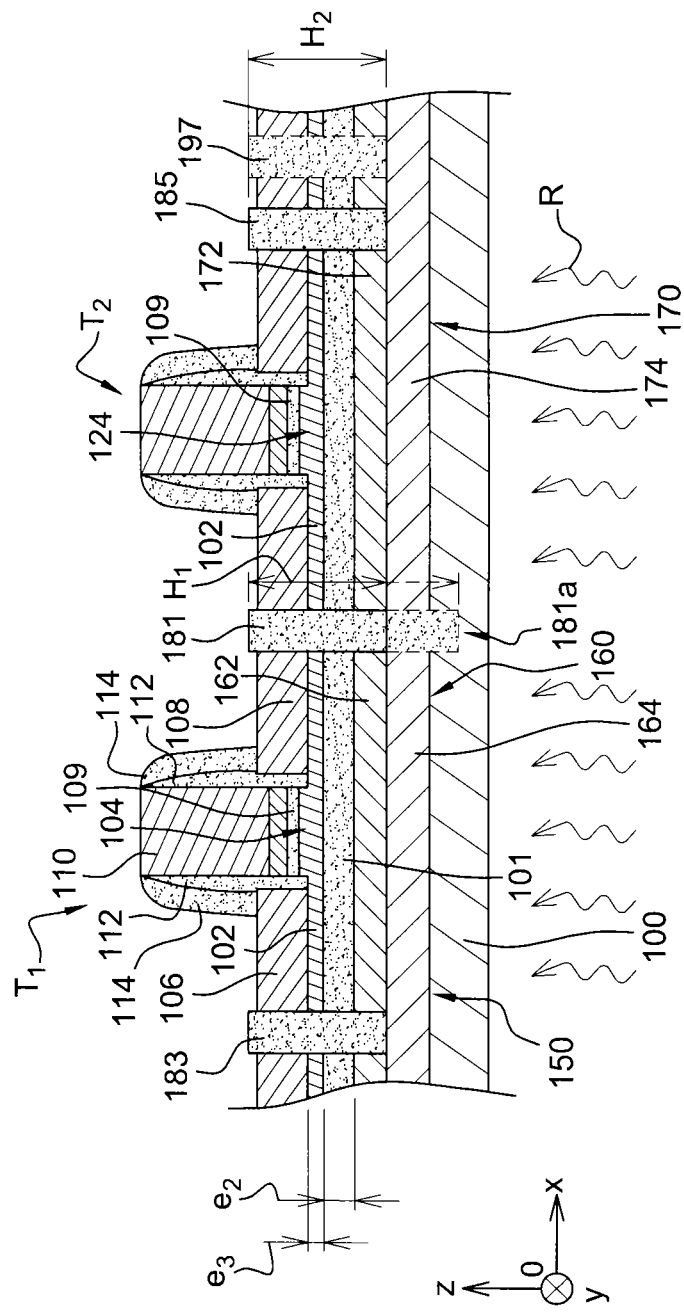

Another alternative of the cell is provided in FIG. 1C. The isolating trench or trenches 183, 185 arranged around junctions 160, 170 are this time provided with a height $H_2$ such that the lower portion 183a, 185a of the trenches 183, 185 is elevated in relation to the lower doped zones 164, 174 of the junctions 160, 170, with these lower doped zones being in contact with each other and able this time to be polarized, by the intermediary of one or several conductive elements 197 arranged to the exterior of the photosensitive logic cell, around the latter. This can also make it possible to make the polarization of the junctions 160, 170 easier.

Alternatively to the example of the structure which has just been described, it can be provided to carry out the transistors $T_1$, $T_2$ on a substrate of the SGOI type (for "SiGe-on-insulator"), i.e. of which the semiconductor surface area 102 is of a SiGe base, or of course a substrate of the semiconductor on insulator type of which the surface layer 102 is of a semiconductor material III-V base.

According to a possibility of implementing the cell structure described hereinabove, the junctions 160, 170 can be formed in the support layer of the substrate 100 of the semiconductor type via ionic implantation through the stack formed of the semiconductor surface area 102 and of the BOX isolating layer 101.

To form the semiconductor zones 162, 172 of type N, an implantation can for example be carried out:
  using Arsenic according to an energy between for example 70 keV and 400 keV and a dose between for example $5^e 12$ cm$^{-2}$ and $5^e 13$ cm$^{-2}$ or,
  using Phosphorus according to an energy between for example 50 keV and 400 keV, and a dose between for example $5^e 12$ cm$^{-2}$ and $5^e 13$ cm$^{-2}$.

To form the semiconductor zones 164, 174 of type P, an implantation can for example be carried out:
  using Boron according to an energy between for example 10 keV and 200 keV, and a dose between for example $5^e 12$ cm$^{-2}$ and $5^e 13$ cm$^{-2}$ or,
  using Indium according to an energy between for example 100 keV and 300 keV, and a dose between for example $5^e 12$ cm$^{-2}$ and $5^e 13$ cm$^{-2}$.

The implantation steps are more preferably followed by at least one step of annealing to repair the defects created by the implantation. The annealing can be carried out for example between 550° C. and 1200° C., with a duration chosen from a range between one ms and up to about ten minutes.

According to a particular example, the implantation annealing can be carried out at 1050° C. for 5 s.

An alternative of the junctions 160, 170 comprises a step of adding the latter on the rear face of the BOX isolating layer, for example par collage.

These junctions can also be carried out via epitaxy of a semiconductor material such as for example Si, or SiGe, or Ge, or InGaAs, or InP, or GaN, or InGaN on the support layer 100 by carrying out for example a doping in-situ or doping by species scattering.

The photosensitive logic cell of FIGS. 1A-1C can be configured in such a way as to form a photosensitive logic inverter, in particular of type CMOS.

Figure 2A:
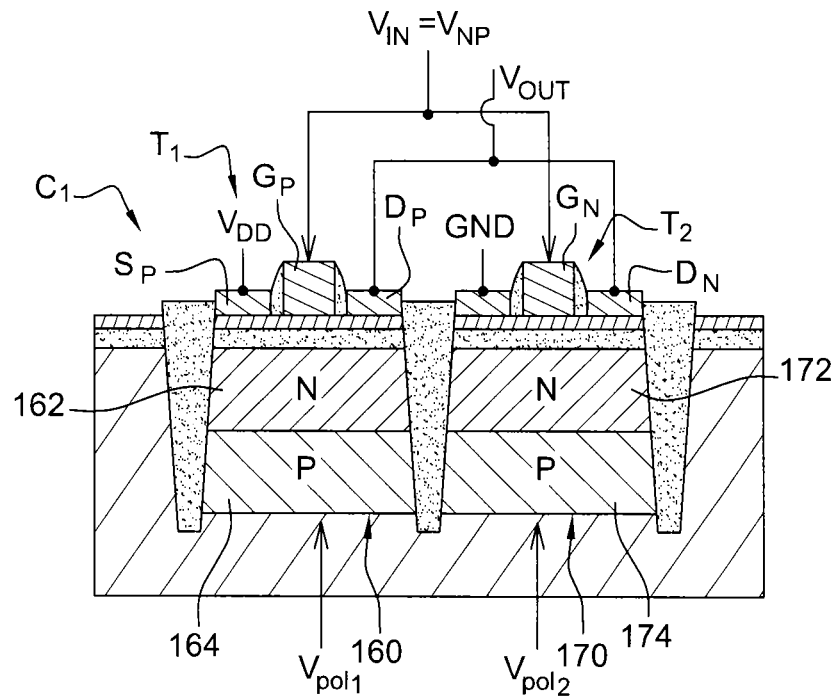
Figure 2B:
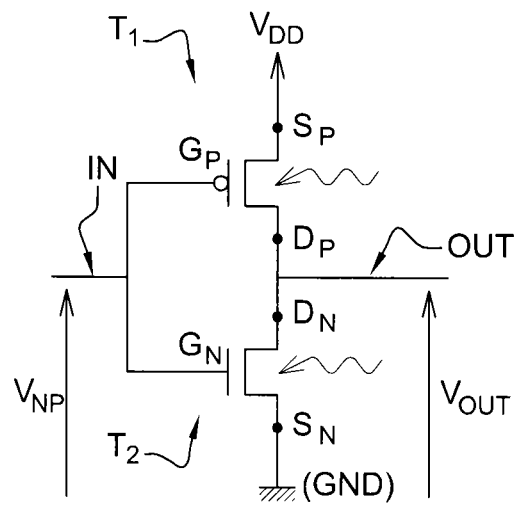
Figure 2C:
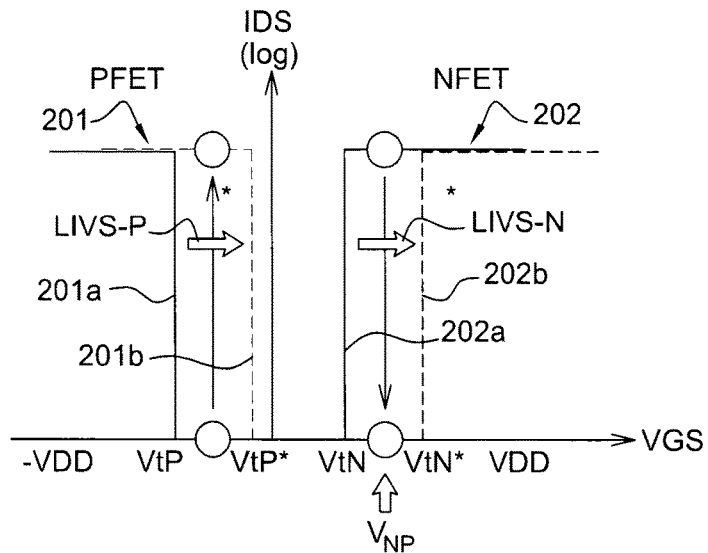
FIGS. 2C-2D show electrical operating characteristics of this inverter.
Figure 2D:
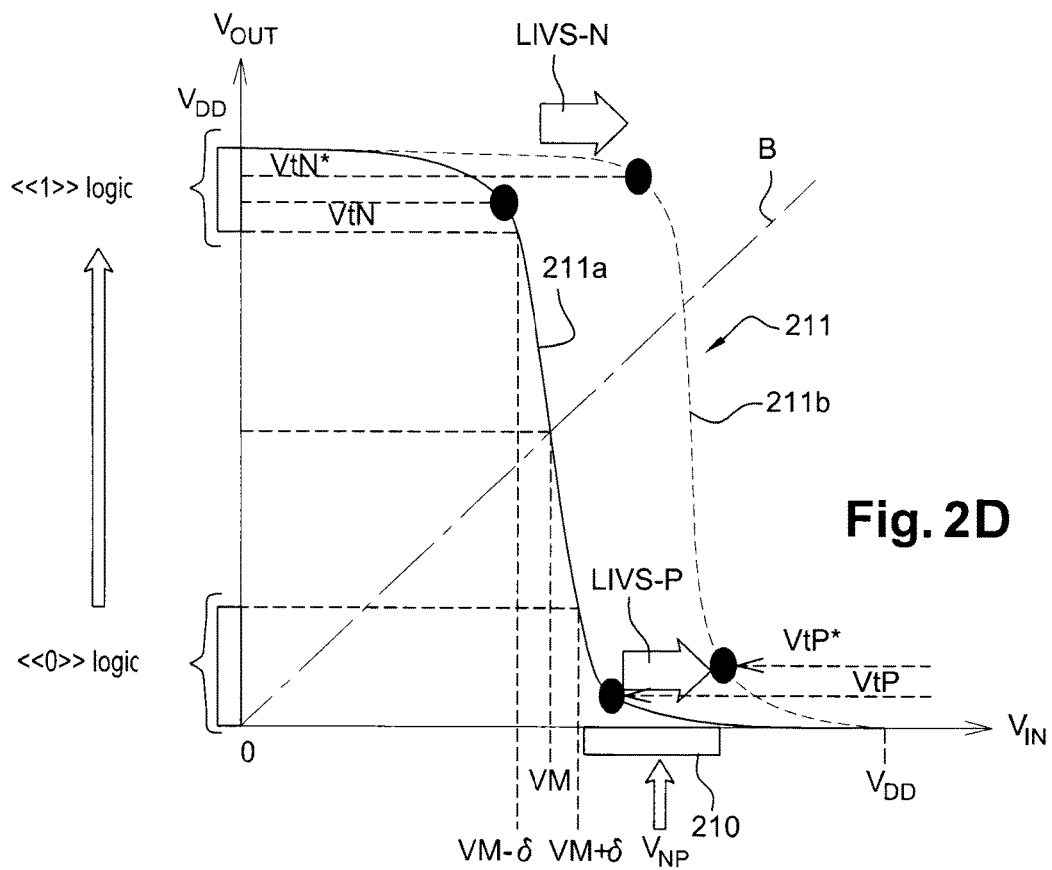

A first example of CMOS photosensitive logic inverter configuration formed using the cell of FIG. 1, is provided in FIGS. 2A-2B, while FIGS. 2C-2D are used to show the operation of this inverter.

In this first example of configuration (FIGS. 2A and 2B), the logic state of a signal $V_{OUT}$ issued as output of the inverter depends on the quantity of photons received by the photosensitive zone opposite the first transistor $T_1$ and the second transistor $T_2$.

The logic inverter comprises a terminal IN connected to the respective gates $G_P$ and $G_N$ of the first transistor $T_1$ and of the second transistor $T_2$, with the gates $G_P$ and $G_N$ being connected together.

A means of polarization is provided to apply to a terminal IN of the inverter an adapted polarization potential $V_{IN}=V_{NP}$, which, in this example of configuration, is a fixed potential, chosen in a predetermined voltage range.

An output OUT of the inverter, making it possible to deliver the logic or binary signal $V_{OUT}$, is connected to the respective drains $D_P$ and $D_N$ of the first transistor $T_1$ and of the second transistor $T_2$, with the drains $D_P$ and $D_N$ being connected together (FIG. 2B).

The device also comprises a means of polarization of the source of the first transistor $T_1$ provided to apply a potential $V_{OD}$ to the source $S_P$ for example of about 1V for transistors having a gate length between 30 and 35 nm, or 0.9V for transistors having a gate length between 26 nm and 32 nm, or 0.75V for transistors having a gate length between 18 nm and 24 nm.

The source $S_N$ of the second transistor $T_2$ can be placed at a reference or GND potential $V_{SS}$ used as a ground.

As such, transistors $T_1$ and $T_2$ are in this example polarized in such a way as to have a constant gate-source voltage $V_{is}$, with the change in the state conduction passing or blocking of the transistors being obtained by a shift in their respective threshold voltages $V_{TN}$, $V_{TP}$ due to a variation in the illumination of the photosensitive zone.

Means of polarization respectively of the first junction 160 and of the second junction 170 are also provided. These means of polarization are configured to apply a first potential Vpol1, for example of about −5V to 5V to the lower doped zone 162 (N-doped in this example) of the first junction 160 and to apply a second potential Vpol2, for example of about −5V to 5V to the lower doped zone 172 (N-doped in this example) of the second junction 170 while the respective upper doped zones of junctions 160, 170 (in this example the P-doped zones 164, 174) are set to a floating potential.

The amplitude of the shift in the threshold voltage induced by light LIVS (noted as $LIVS_N$ for the N-type transistor and $LIVS_P$ for the P-type transistor) depends for each transistor on a ratio called the "Body Factor" for the capacity between its channel and a region of the photosensitive zone playing the role of a rear gate, The Body Factor (BF) depends on the polarization potential applied (respectively Vpol1 for the first transistor and Vpol2 for the second transistor) to the lower doped zones 172, 174.

It can be provided for example to apply the same polarization potential Vpol1=Vpol2 to the lower doped zone 162 and to the lower doped zone 172.

Alternatively different polarization potential $Vpol_1$ and $Vpol_2$ can be applied respectively to the lower doped zone 162 and to the lower doped zone 172, in such a way as to implement a shift in the threshold voltage induced by the light $LIVS_P$ for the first transistor of type P different from the shift of the threshold voltage induced by the light $LIVS_N$ for the second transistor of type N.

The sign of the voltage Vpol1, Vpol2 applied to control the shift in the threshold voltage LIVS depends on the direction of the junction (P/N or N/P), under the BOX isolating layer whereon one the channels of the transistors rests.

In FIG. 2C, curves 201, 202 of respective variations of the drain-source currents of the first transistor $T_1$ and of the second transistor $T_2$ according to their respective gate-source voltages are given. This figure shows the shifts in the threshold voltages $LIVS_P$ of the first transistor $T_1$ and $LIVS_N$ of the second transistor $T_2$ generated by the receiving of a given quantity of photons or by a given increase in the quantity of photons received by the photosensitive zone arranged opposite transistors $T_1$, $T_2$.

The threshold voltage of the first transistor $T_1$ is able to pass from a value Vtp when the photosensitive zone is not lit or insufficiently lit (portion 201a of the curve 201 in a continuous line) to a value Vtp* when the photosensitive zone is lit or sufficiently lit (portion 201b of the curve 201 as a broken line), with |Vtp*−Vtp| which can be for example about 100 mV. For the same quantity of photons received by the photosensitive zone, this difference in threshold voltage |Vtp*−Vtp| can be increased by decreasing the thickness $e_2$ of the insulating layer 101 of the lower substrate, and/or by increasing the chosen thickness $e_3$ of the semiconductor surface area, and/or by increasing the thickness chosen of the gate dielectric of the first transistor $T_1$.

Likewise, the threshold voltage of the second transistor $T_2$ is able to pass from a value Vtn when the photosensitive zone is not lit or insufficiently lit (portion 202a of the curve 202 as a continuous line) to a value Vtn* when the photosensitive zone is lit or sufficiently lit (portion 202b of the curve 202 as a broken line), with Vtn*−Vtn which can be for example about 100 mV.

In this example configuration, the arrangement of the P- and N-doped zones of the junctions 160, 170 is such that, a change in the illumination of the photosensitive zone causes a shift in the respective threshold voltages Vtn and Vtp of the transistors in the same direction of variation (VtN increasing and VtP decreasing in absolute value). As such, an increase in the quantity of photons received by the photosensitive zone of the logic inverter is here able to induce a decrease (in absolute value) of the threshold voltage of the first transistor $T_1$ (of type P) and an increase in the threshold voltage of the second transistor $T_2$ (of type N).

FIG. 2D shows a transfer function of the output signal $V_{OUT}$ according to the signal applied as input of the first example of logic inverter when the latter is subjected to a light radiation (curve portion 211a) and when the latter is not subjected to a light radiation (curve portion 211b).

When the fixed polarization potential $V_{NP}$ applied on the terminal IN is chosen from an adapted voltage range (indicated by a portion 210 on the axis of the abscissa) and when the photosensitive zone of the inverter passes from a first state of illumination (for example an unlit or insufficiently lit state) to a second more substantially lit state, the signal $V_{OUT}$ as the output of the inverter is able to pass from a level $V_{OUT}=0V$ representing for example a logic 0 at the output of the inverter to a level $V_{OUT}=V_{DD}$ representing for example a logic 1 at the output of the inverter.

The operation can be reversed in such a way that when the fixed polarization potential $V_{NP}$ of the terminal IN is situated in the adapted voltage range, the signal $V_{OUT}$ as the output of the inverter can change from a level $V_{OUT}=V_{DD}$ representing for example a logic 1 at a level $V_{OUT}=0V$ representing for example a logic 0 consecutively to the passing of the photosensitive zone on the inverter from the second state of illumination (lit or sufficiently lit) to the first state of illumination (unlit or insufficiently lit).

The polarization potential $V_{NP}$ is in this example chosen in such a way as to be greater than a potential $V_M$ corresponding to the potential for which the potential $V_{OUT}$ as output OUT of the inverter is equal to the potential $V_{IN}$ applied to the terminal IN. The potential $V_M$ is defined as the point in the transfer curve of the inverter for which $V_{IN}=V_{OUT}$ (and which corresponds to an intersection between the transfer curve 211 with a bisector B of an angle formed by the axes of a mark whereon the curve 211 is shown).

The polarization potential $V_{NP}$ is chosen more preferably such that $V_{NP}$ is greater than $V_M+\delta$ with δ a voltage depending on the noise margin and which is a function of the voltage $V_{DD}$.

The polarization potential $V_{IN}=V_{NP}$ applied to the terminal IN is chosen advantageously such that:

$$V_M + \delta < V_{NP} < V_M + \delta + \frac{LIVS_N + |LIVS_P|}{2}$$

Or,

-continued $$V_M = \frac{V_{DD} - |Vt_P| + Vt_N\sqrt{\frac{\beta_N}{\beta_P}}}{1 + \sqrt{\frac{\beta_N}{\beta_P}}}$$

with:

$$\beta_N = \mu_N * Cox_N * \left(\frac{W}{L}\right)_N$$

$$\beta_P = \mu_P * Cox_P * \left(\frac{W}{L}\right)_P$$

Although a conventional inverter flip-flops at a voltage $V_M$, it can be considered in this case that:

the logic output level is at a logic level 1 when $V_{IN} < V_M - \delta$, the logic output level is at a logic level 0 when $V_{IN} > V_M + \delta$, We shall define:

$$|Vt_P*| = |Vt_P| + LIVS_P$$

with:

$LIVS_P < 0$ for an arrangement BOX/N/P of the N- and P-doped zones of the junctions i.e. as in FIG. 2A and $$Vt_N* = Vt_N + LIVS_N$$

with:

$LIVS_N > 0$ for an arrangement BOX/N/P of the N- and P-doped zones of the second junction such as in FIG. 2A.

The polarization potential $V_{NP}$ of the input IN can be chosen for example in such a way that $V_{NP} \in [VM; VM+200\ mV]$ $V_M$ is dependent on $Vt_N$, $Vt_P$, and on $V_{DD}$.

If to the photosensitive logic inverter a first level of illumination is applied, the transistor $T_2$ of type N is pass-through and the transistor $T_1$ of type P is blocked. The output is as such placed at the potential Vss or ground, i.e. at the low state. Inversely, when to the photosensitive logic inverter a second level of illumination is applied, the transistor $T_1$ of type P is pass-through and the transistor $T_2$ of type N is blocked. The output is therefore at the potential $V_{DD}$ which reveals a high state. An inversion function or a logic NOT has as such been carried out.

The first example of the photonic logic inverter can as such follow the following truth table:

| IN | Light | OUT |
|---|---|---|
| $V_{NP}$ | NO | 0 |
| $V_{NP}$ | YES | 1 |

Figure 3A:
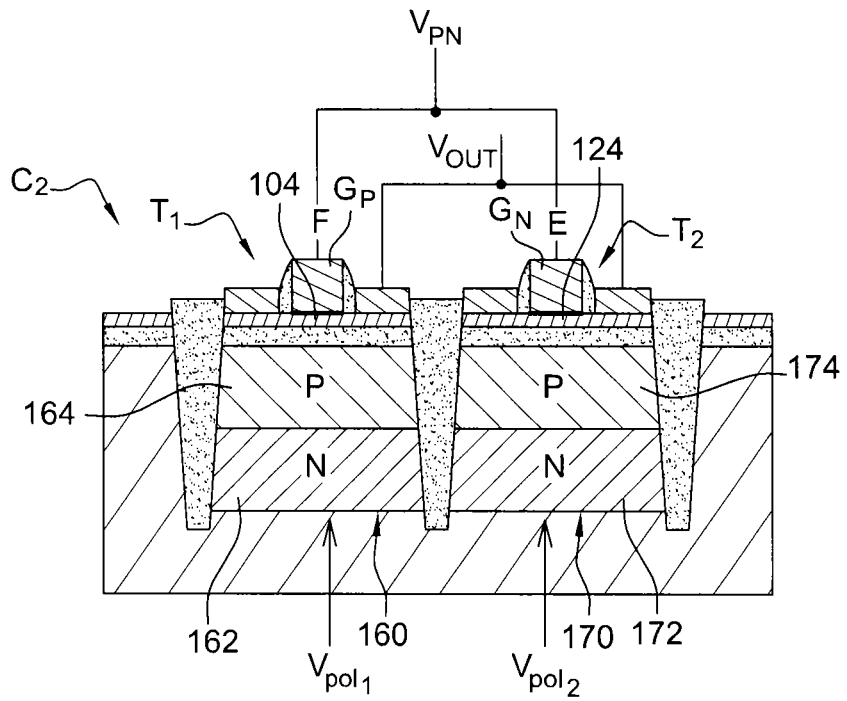
Figure 3B:
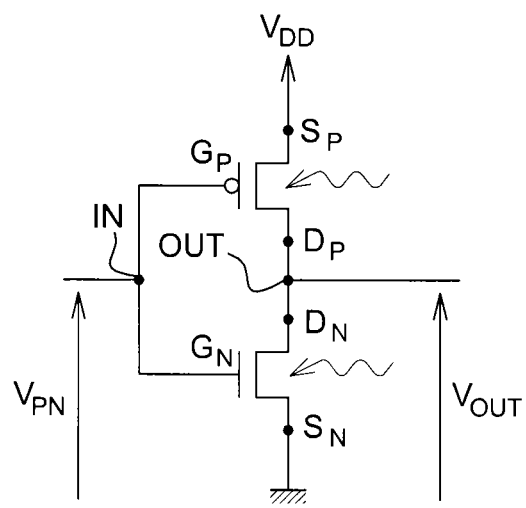
Figure 3C:
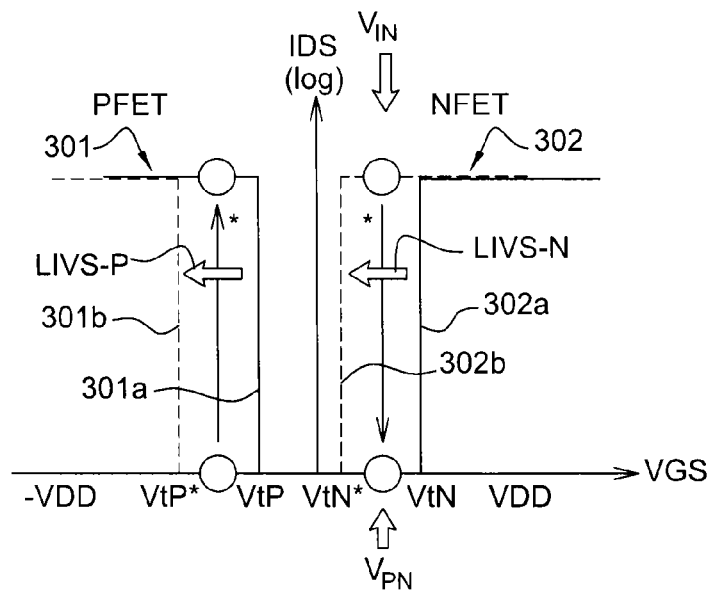
FIGS. 3C-3D show electrical operating characteristics of this inverter.
Figure 3D:
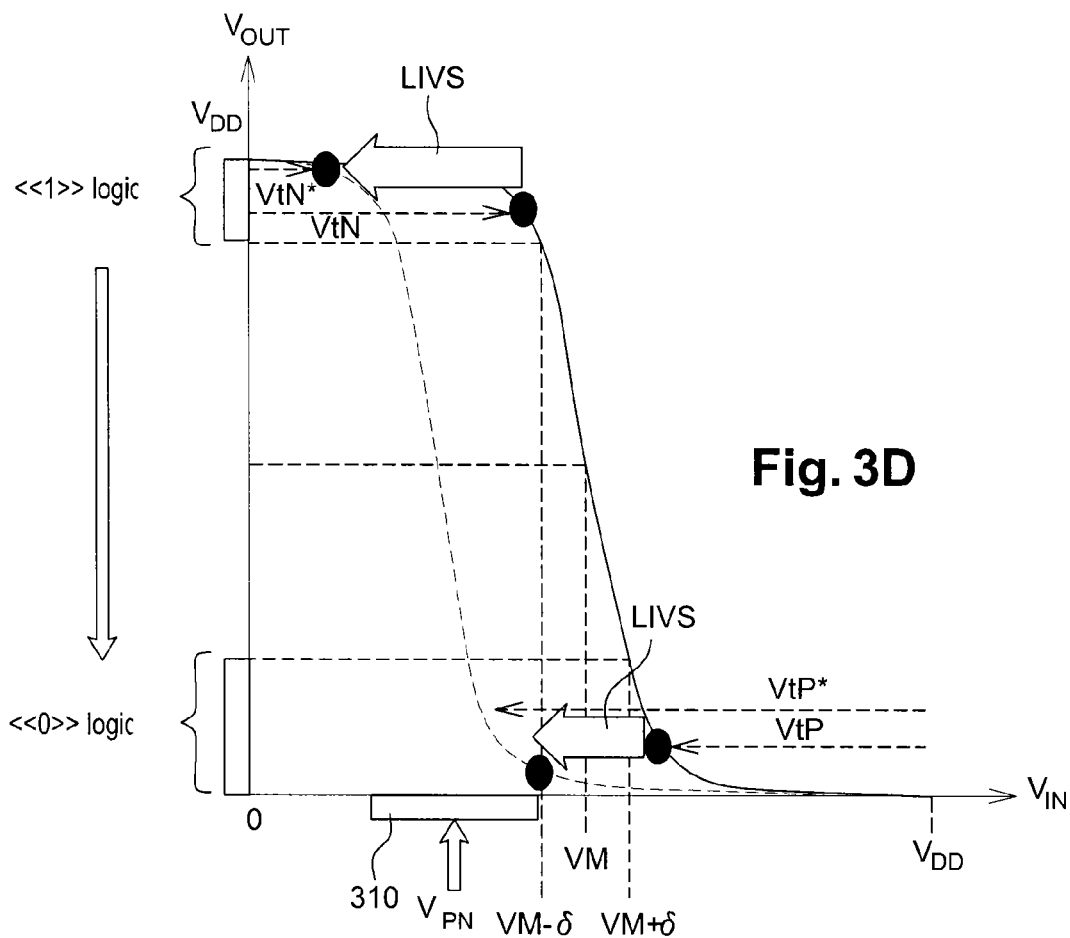

A second example of photosensitive logic inverter configuration is given in the FIGS. 3A-3B, while the FIGS. 3C-3D are used to show its operation.

The configuration of the second example of an inverter differs from that of the inverter described hereinabove in particular through the arrangement of the junctions 160, 170.

The arrangement of the doped zones 162, 164 forming the first junction 160 is in this example (FIG. 3A) such that the P-doped zone 164 is arranged between the channel zone 104 of the first transistor $T_1$ and the N-doped zone 162. The arrangement of the doped zones 172, 174 forming the second junction 170 is such that the P-doped zone 174 is arranged between the channel zone 124 of the second transistor $T_2$ and the N-doped second zone 172.

As such, the second P-doped zones 164, 174 form in this example the upper zones of the junctions, while the N-doped zones 162, 172 form the lower zones of the junctions.

Means of polarization respectively of the first junction 160 and of the second junction 170 can be provided to apply a first potential $Vpol_1$ to the lower doped zone 162 (N-doped in this example) of the first junction 160 and a second potential $Vpol_2$ to the lower doped zone 172 (N-doped in this example) of the second junction 170, while the respective upper doped zones of the junctions 160, 170 in this example the P-doped zones 164, 174 of the junctions are set to a floating potential.

With regards to the arrangement of the transistors (FIG. 3B) and the polarization of their respective electrodes of source $S_P$ and $S_N$, the configuration of the second example of inverter is similar to that of the first example of inverter described hereinabove.

The terminal IN connected to the respective gates $G_P$ and $G_N$ of the first transistor $T_1$ and of the second transistor $T_2$, is this time set to an adapted fixed polarization potential $V_{PN}$. The transistors $T_1$ and $T_2$ are as such polarized in such a way as to have a constant gate-source voltage $V_{GS}$, a change in the respective pass-through or blocked state of the transistors can be obtained by varying their respective threshold values $V_{TP}$ and $V_{TN}$, with this variation being itself dependent on the state of illumination of the photosensitive zone.

FIG. 3C gives variation curves 301, 302 of the respective drain-source currents of the first transistor $T_1$ and of the second transistor $T_2$ according to their respective gate-source voltages. It shows the shifts $LIVS_P$ and $LIVS_N$ (shown respectively by a shift between the curve portion 301a and the curve portion 301b for the P-type transistor and by a shift between the curve portion 302a and the curve portion 302b for the N-type transistor) of the respective threshold voltages of the first transistor and of the second transistor generated by an illumination or an increase in the illumination of the photosensitive zone.

The threshold voltage of the first transistor $T_1$ (of type P) increases in absolute value, while the threshold voltage of the second transistor $T_2$ (of type N) decreases in absolute value. The threshold voltage shift Vt is done here in the same direction (negative).

In this example, so that the output of the inverter can flip-flop from one logic state to another according to the illumination state of the photosensitive zone, the input IN of the inverter is polarized at a fixed potential $V_{PN}$ chosen in an adapted range (portion 310 on the axis of the abscissa of FIG. 3D) of voltages.

The polarization potential $V_{PN}$ is in this example chosen in such a way as to be less than the potential $V_M$ and more preferably such that $V_{PN}$ is less than $V_M - \delta$ with $\delta$ a voltage that depends on the noise margin.

The polarization potential $V_{PN}$ applied to the terminal IN is advantageously chosen such that:

For an arrangement BOX/P/N of the doped zones of the junctions such as shown in FIG. 3A, $V_{PN}$ is defined by:

$$V_M - \delta - \frac{LIVS_P + |LIVS_N|}{2} < V_{PN} < V_M - \delta$$

with $LIVS_P > 0$ and LIVSN<0.

When the polarization potential $V_{PN}$ of the input IN is chosen from the adapted voltage range and when the photosensitive zone of the inverter is in a first unlit or insufficiently lit state the signal $V_{OUT}$ as the output of the inverter is at a level $V_{OUT}=V_{DD}$ representing for example a logic '1' at the output of the inverter. When the polarization potential $V_{PN}$ of the input IN is chosen in the adapted voltage range and when the photosensitive zone of the inverter is in a second lit or sufficiently lit state, the signal $V_{OUT}$ at the output of the inverter is at a level $V_{OUT}=0V$ representing for example a logic '0' at the output of the inverter.

The second example of photonic logic inverter can as such follow the following truth table:

| IN | Light | OUT |
|---|---|---|
| $V_{NP}$ | NO | 1 |
| $V_{NP}$ | YES | 0 |

Using photosensitive cells such as described hereinabove, a logic circuit can be implemented able to be controlled by light and of which the functions, in particular logic, can be modified according to the level of illumination that this logic circuit receives.

FIGS. 2D and 3D show that, in a certain voltage range applied to the input IN of a photosensitive logic inverter it is possible to flip-flop, by a variation in illumination and a sufficient supply of photons, the OUT logic output of the inverter, the logic state of this output OUT does not flip-flop when the supply of photons is insufficient.

The function that can be modified via illumination can be for example a function of collective programming of cells or reset. Such a logic circuit can be implemented for example in such a way that a brief light pulse or a light flash makes it possible to flip-flop a set of photosensitive logic inverters. A logic circuit controlled, or programmed, or reset, without requiring specific addressing, by the intermediary of a light flash applied for example at the rear of a chip puce whereon this circuit is mounted can as such be carried out.

Figure 4A:
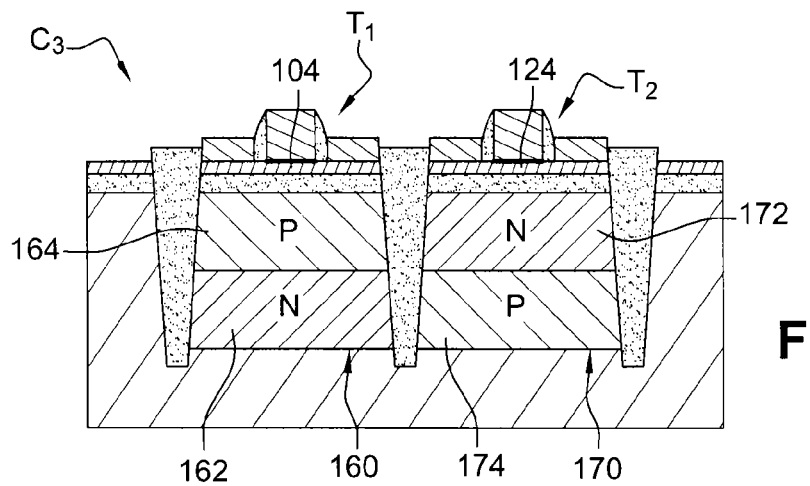
Figure 4B:
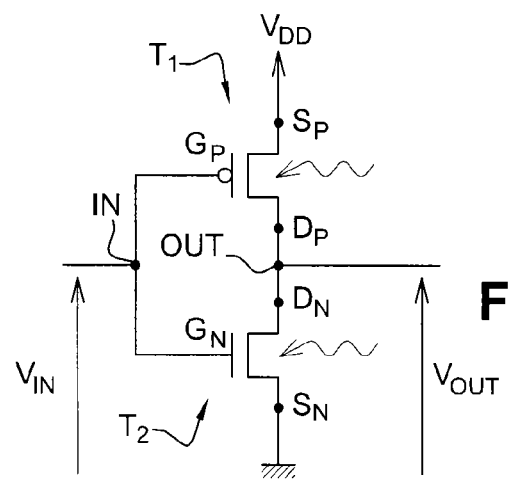
Figure 4C:
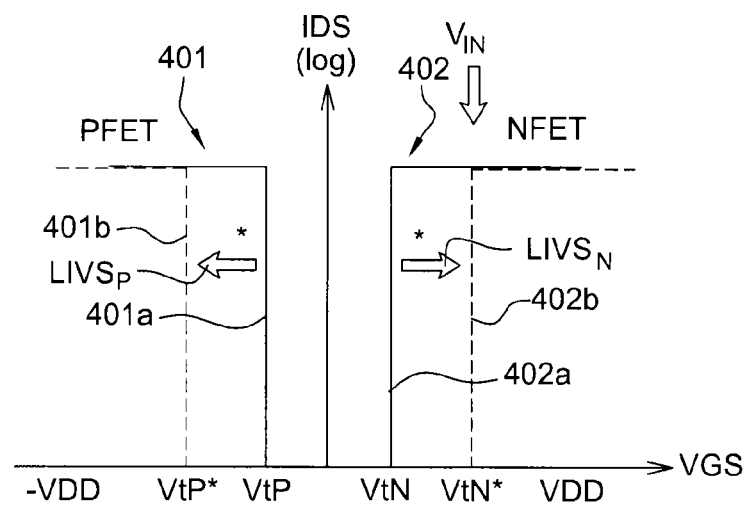
FIGS. 4C-4E show electrical operating characteristics of this inverter.
Figure 4D:
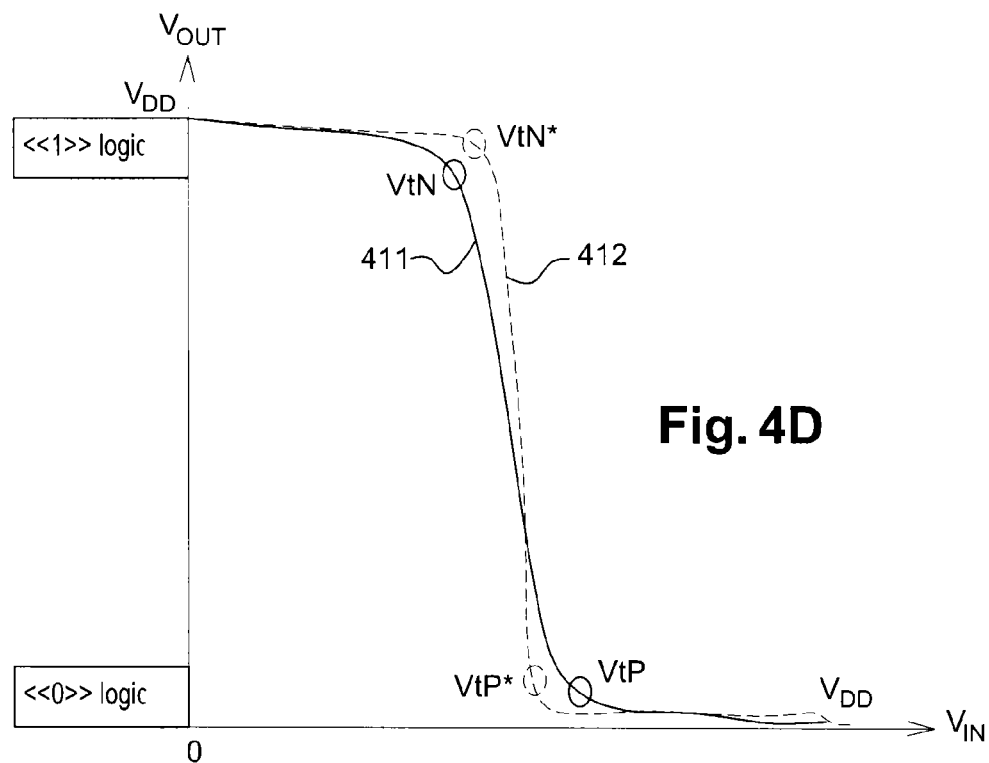
Figure 4E:
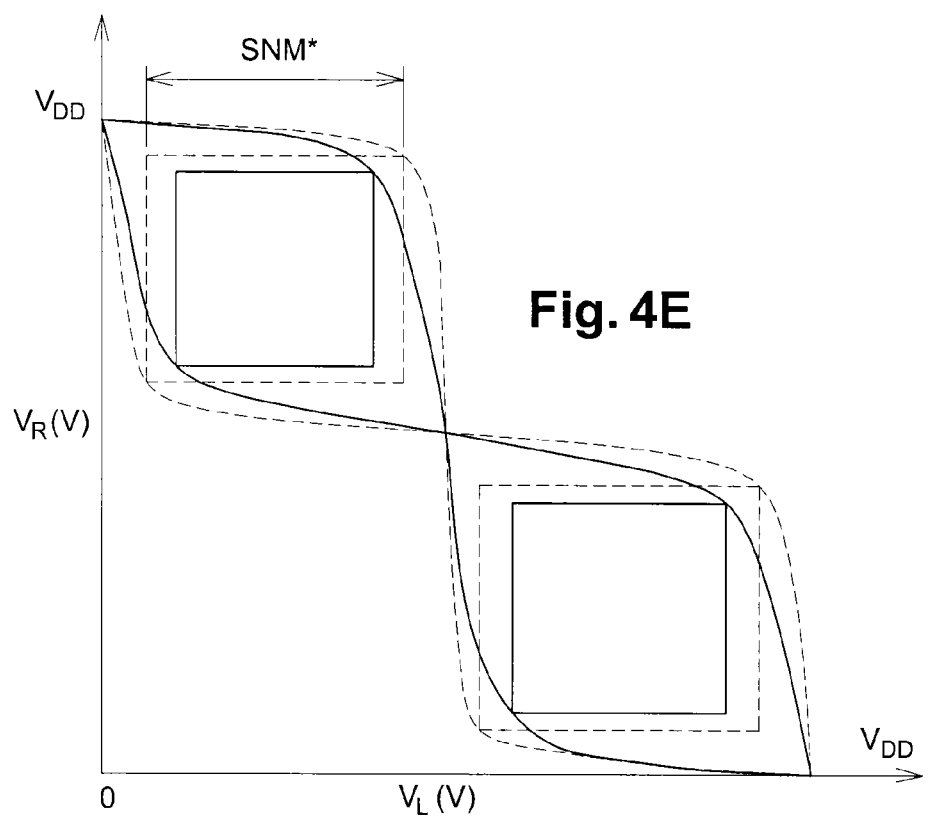

An alternative photosensitive logic inverter configuration is given in FIGS. 4A-4B, with FIGS. 4C-4E used to show its operation.

For this alternative, the logic state '1' or '0' of the output signal $V_{OUT}$ of the inverter does not depend here, contrary to the examples described hereinabove, on the quantity of photons received by the photosensitive zone in other words on the illumination state of the latter, but on a logic state '0' or '1' for an electric input signal $V_{IN}$ applied as input IN of the inverter.

As such, this alternative photosensitive logic inverter configuration differs from the examples described hereinabove by the type of signal $V_{IN}$ applied as input IN (FIG. 4B), with this signal being a variable voltage, able to adopt at least one first value for which the transistor $T_1$ of type P is blocked while the transistor $T_2$ of type N is pass-through, and at least one second value for which the transistor $T_1$ of type P is pass-through while the transistor $T_2$ of type N is blocked.

This third example of an inverter also differs from those described hereinabove by the arrangement of the junctions 160, 170.

The arrangement of the doped zones 162, 164 forming the first junction 160 is such that the P-doped zone 164 is arranged on the N-doped zone 162, while that of the second junction 170 is such that the N-doped zone 172 is arranged on the P-doped zone 174 (FIG. 4A).

In FIG. 4C, curves 401, 402 of the respective variations of the drain-source currents of the first transistor $T_1$ and of the second transistor $T_2$ according to their respective gate-source voltages are given.

This figure shows that an increase in the quantity of photons received by the photosensitive zone is able to generate an increase in the threshold voltage of the second transistor $T_2$ with this increase being translated by a shift between a curve portion 402a as a continuous line showing an unlit state of the photosensitive zone and a curve portion 402b as a broken line showing a lit state of the photosensitive zone. Likewise, an increase in the quantity of photons received by the photosensitive zone is able to generate an increase (in absolute value) of the threshold voltage of the first transistor $T_1$.

For this alternative configuration, the photosensitive logic inverter has a transfer function of a conventional inverter when it is not receiving light radiation. The rapidity of the transition into output OUT from a logic state to another logic state is then translated by a given slope of the curve portion 411 in FIG. 4D. When the photosensitive logic inverter receives a light radiation the rapidity of the transition from a logic state to another logic state is in this case more substantial which results in a slope of the curve portion 412 in FIG. 4D that is higher than that of the curve portion 411.

Figure 5A:
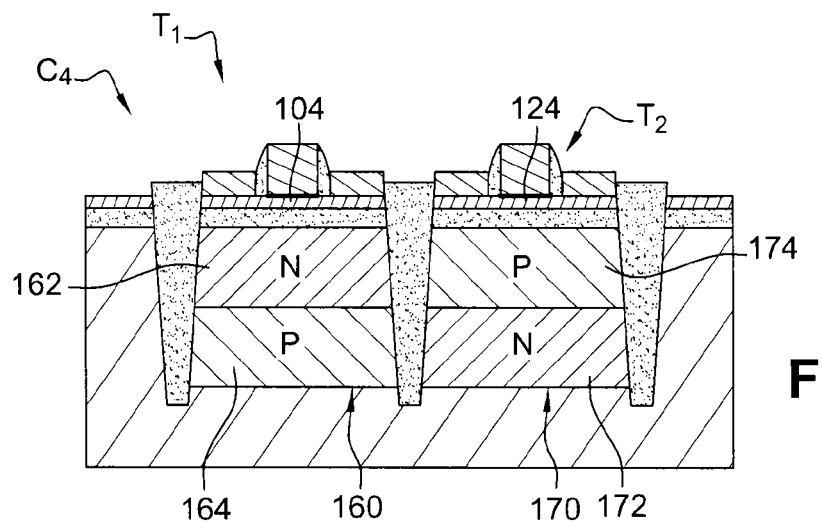
Figure 5B:
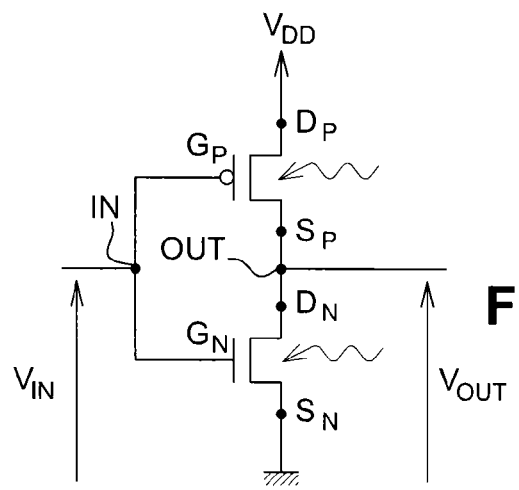

FIGS. 5A-5D are used to show another example of photosensitive logic inverter configuration that differs from the example described hereinabove in particular by the arrangement of the junctions 160, 170 (FIG. 5A).

In this fourth example, the arrangement of the doped zones 162, 164 forming the first junction 160 is such that the N-doped zone 162 is arranged between the channel zone 104 of the first transistor $T_1$ and the P-doped zone 164. The arrangement of the doped zones 172, 174 forming the second junction 170 is such that the P-doped zone 174 is arranged between the channel zone 124 of the second transistor $T_2$ and the N-doped zone 172.

Figure 5C:
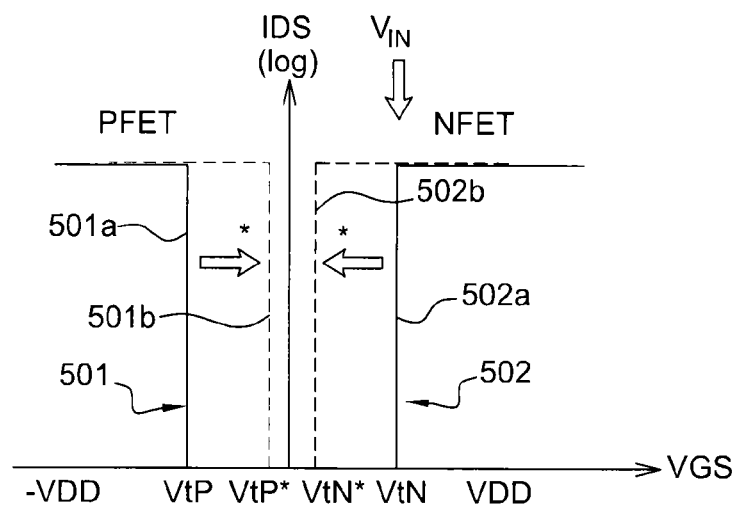
FIGS. 5C-5D show electrical operating characteristics of this inverter.

FIG. 5C gives curves 501, 502 of respective variations of drain-source currents of the first transistor $T_1$ and of the second transistor $T_2$ according to their gate-source voltages and shows that an increase in the quantity of photons received by the photosensitive zone is able to generate a decrease (in absolute value) of the threshold voltage of the first transistor $T_1$ (decrease translated by a shift between a curve portion 501a as a continuous line showing an unlit state of the photosensitive zone and a curve portion 501b as a broken line showing a lit state of the photosensitive zone) while a decrease in the threshold voltage of the second transistor $T_2$ (decrease translated by a shift between a curve portion 501a as a continuous line showing an unlit state of the photosensitive zone and a curve portion 502b as a broken line showing a lit state of the photosensitive zone).

Figure 5D:
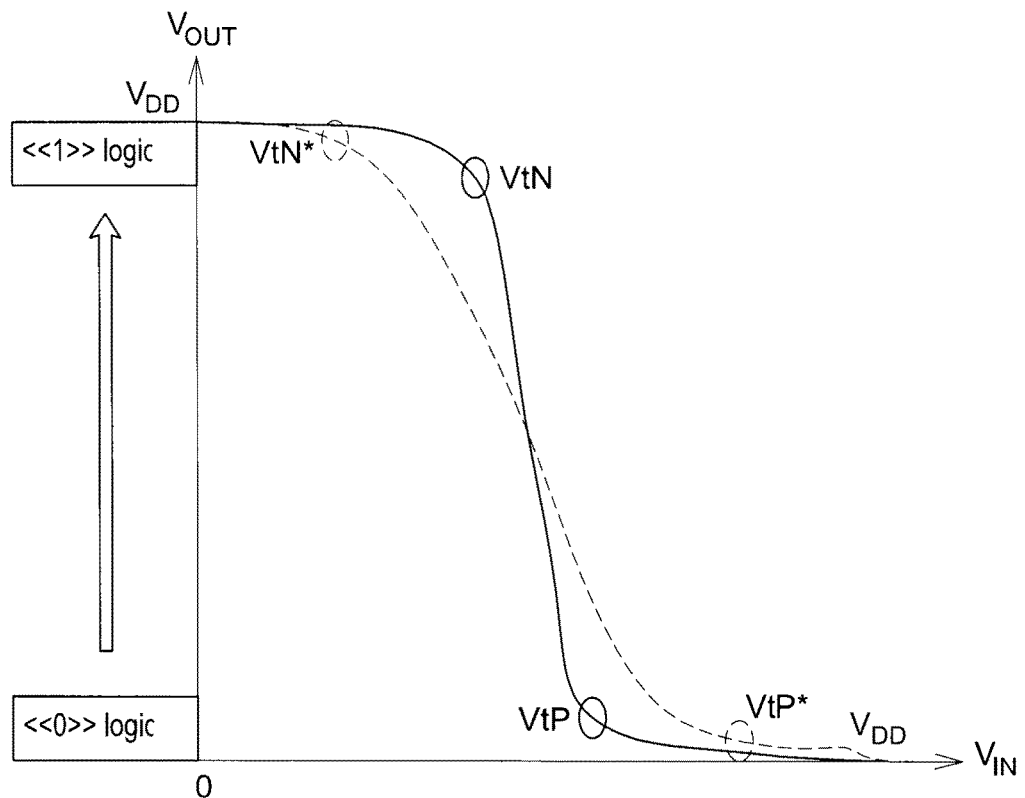

For this embodiment, as for the preceding one, the switching speed from one logic state to another as output OUT depends on the illumination state of the photosensitive zone (FIG. 5D).

A matrix arrangement of the photosensitive logic inverter according to one or the other of the embodiments described hereinabove can be provided.

Figure 6A:
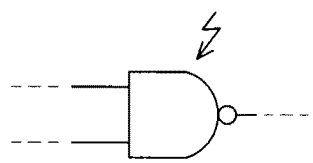
FIGS. 6A, 6B, 6C show examples of logic functions able to be implemented using a photosensitive logic inverter according to the invention.
Figure 6B:
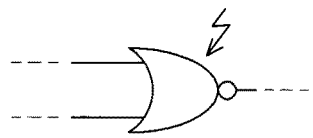

Using a photosensitive logic inverter according to one or the other of the configurations described hereinabove, a logic circuit can also be implemented comprising at least one logic gate requiring an inverting logic function or "NOT", for example a "NOT AND" photosensitive logic gate (FIG. 6A) or photosensitive "NOT OR" (FIG. 6B).

Figure 6C:
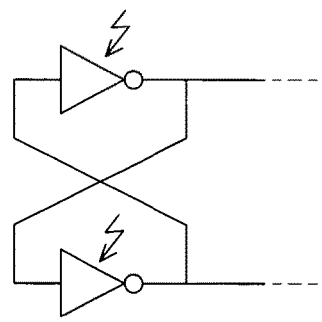
Figure 7:
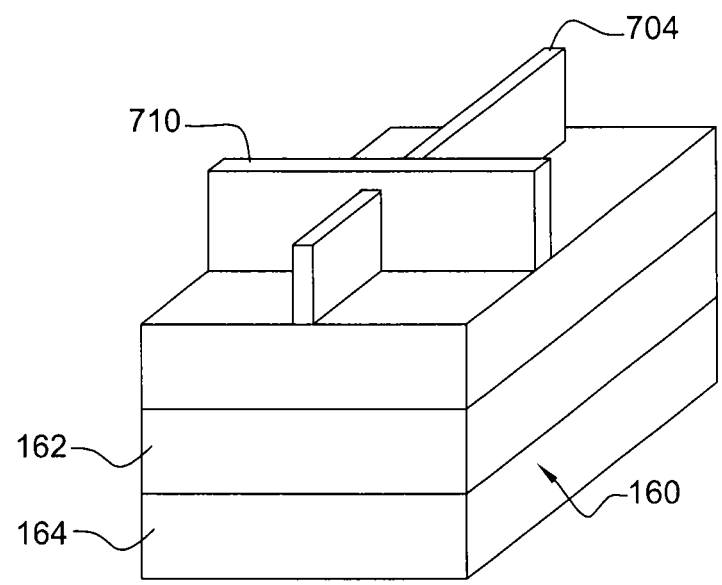
FIG. 7 shows an example of a transistor carried out in finFET technology for the implementation of a photosensitive logic inverter according to the invention.

A photosensitive logic inverter can also be integrated into a circuit forming a photosensitive flip-flop (FIG. 6C), for example a SRAM memory flip-flop.

Figure 8:
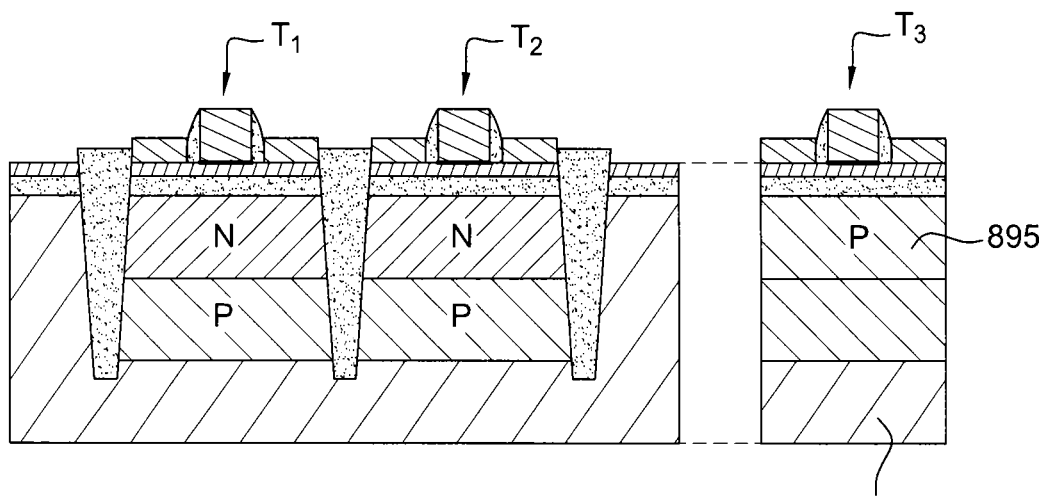
FIG. 8 shows an embodiment wherein the transistors of a photosensitive logic cell are juxtaposed with a transistor of which the threshold voltage does not vary or varies little according to a quantity of photons received.

According to an alternative embodiment of one or the other of the examples of devices that have just been described, it can be provided to form the transistor $T_1$ of type P and the transistor $T_2$ of type N of the inverter according to a technology of the finFET type, i.e. with a channel zone in the form of an etched semiconductor bar 704 which extends over the insulating layer 101 of the substrate, and a gate 710 surrounding a portion of the semiconductor bar 704. FIG. 8 shows an embodiment of the first transistor $T_1$ of type P of the photosensitive logic cell according to such a finFET technology. The junction 160 formed from the N-doped zone 162 and from the P-doped zone 164 superimposed extends in the support layer opposite a portion of the semiconductor bar 704 covered by the gate 710 and intended to form a channel.

A photosensitive logic inverter such as described hereinabove can be integrated into a device comprising one or several other transistors, for example transistors of a processing circuit, of which the threshold voltage does not vary or varies little according to the light radiation received by a zone of the support layer located opposite the latter.

In FIG. 8, an example of such a device is shown and comprises a transistor $T_3$ juxtaposed with the transistors $T_1$ and $T_2$ forming a photosensitive logic cell opposite which a single doped zone 895 is provided in a region of the support layer 100.

This doped zone 895, for example of type P and to which a polarization potential can be applied, forms a ground plane by replacing the photosensitive zone, in order to make the transistor $T_3$ insensitive to light radiation.

According to another possibility of implementing, a photosensitive logic inverter according to the invention can be integrated into a device comprising several levels of superimposed transistors.

Figure 9:
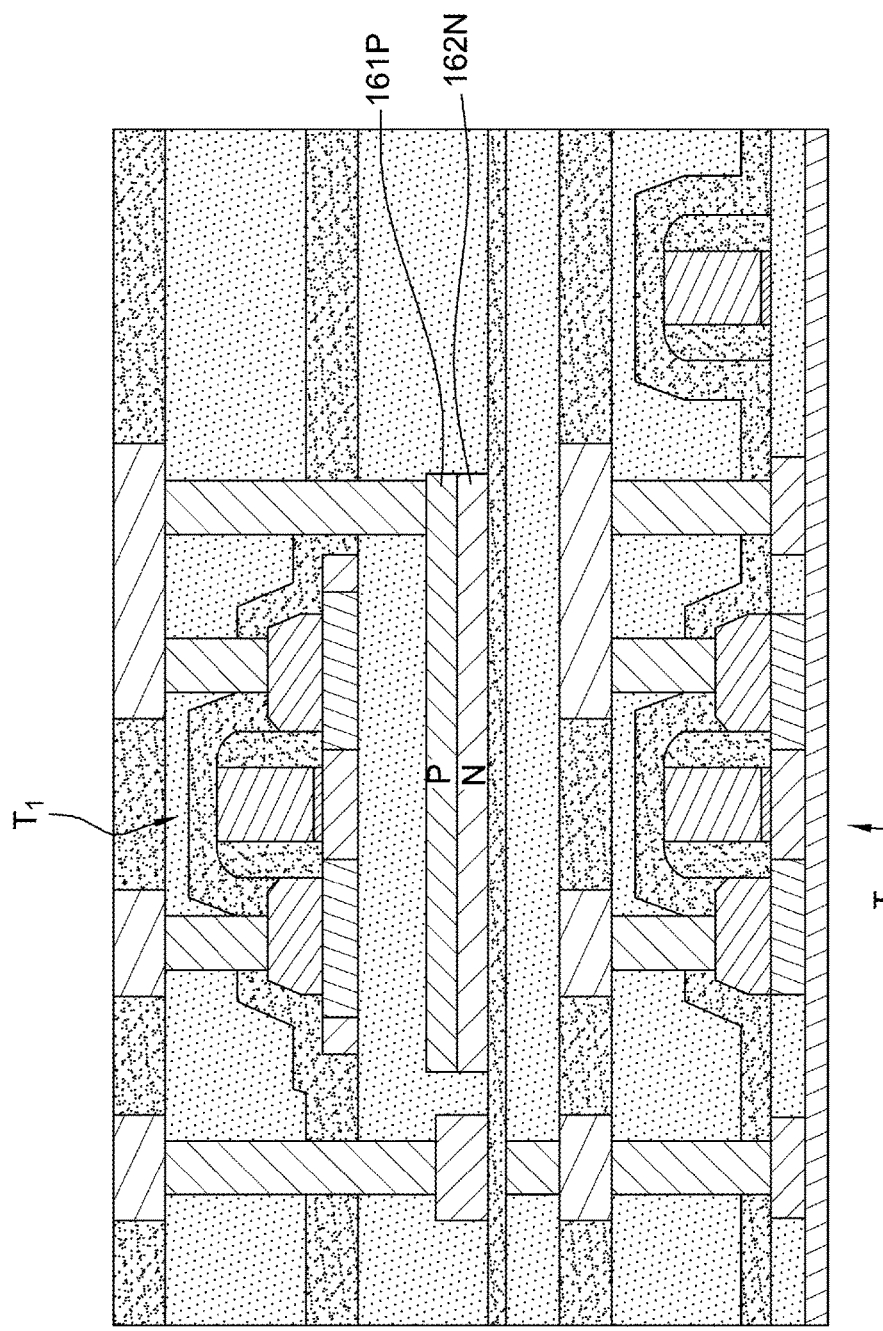
FIG. 9 shows an example of a device with components superimposed over several levels provided with a photosensitive logic cell according to the invention.

In FIG. 9, an example of such a device is shown and comprises a transistor $T_3$ for example of a processing circuit located at a given level $N_k$ of a plurality of levels of superimposed components, while the transistors forming the photosensitive logic inverter (only the transistor $T_1$ of type P is shown in this figure) are located at a higher level $N_{k+1}$.

As in the preceding embodiment, the transistor $T_3$ can be insensitive to a light radiation, in such a way that its threshold voltage does not vary or varies little according to the quantity of photons that the device receives.

As such, the channel zone of the transistor $T_3$ is not located opposite a junction susceptible to act on its threshold voltage.

In one or the other of the examples of photosensitive logic cells described hereinabove, when the photosensitive zone is lit charge carriers accumulate in regions located under the BOX isolating layer 101 at the interface respectively with the two junctions PN or NP. When the junctions are left to be floating and when passing the from a lit status of the cell to a state of obscurity, the discharge time of these regions can be slow.

A creation of the defects by implantation in the junctions can possibly make it possible to facilitate this discharge.

Another manner to allow for a rapid discharge of the BOX/junction interface and this without modifying the structure of the cells, is to provide a polarization control circuit of cell(s) configured to emit a specific erase or reset pulse. This pulse is in the form of a step voltage or of a front of which the direction of variation depends on the type of junction PN or NP located under the BOX isolating layer.

This reset or erase pulse can be applied to the respective gates of the transistors of the cell located opposite the junctions and transmitted by electrostatic or capacitive coupling.

The reset or erase pulse can be emitted periodically during a reset or erase phase provided during each operating cycle of the photosensitive logic cell and can precede or follow each read phase wherein the logic state of the cell is read.

As such, an example of an operating sequence of a matrix of photosensitive logic cells according to this principle comprises an initialization phase of the matrix, then a waiting phase for example of a magnitude of a several nano-seconds during which the lit cells are charged, then a read phase. Then, such a sequence is reiterated.

Figure 10:
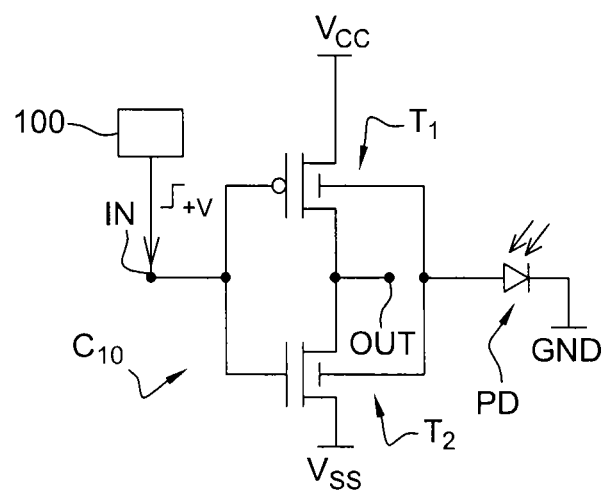
FIG. 10 shows an example means for making it possible to discharge an accumulation of electrons at the interface between the BOX isolating layer and the PN junctions of a cell of the type of that of FIG. 3A.

FIG. 10 shows an example of a device provided with such a polarization control circuit 100 adapted to a photosensitive logic cell $C_{10}$. This cell $C_{10}$ has a configuration of the junctions that is similar to that of the cell described hereinabove in liaison with FIGS. 3A and 3B, i.e. with P-doped zones arranged on the N-doped zones and inserted as such between the N-doped zones and the BOX isolating layer. The representation used to show the coupling effect between front face and rear face of the substrate is such that the transistors are shown with a second gate in the rear face, with the junctions being symbolized by a photodiode PD.

In this example, where the accumulated charges at the rear face under the BOX isolating layer are holes, the step voltage emitted by the circuit 100 in order to be able to accelerate the discharge at the BOX/junction interface is a positive step voltage, applied to the terminal IN connected to the gates of transistors $T_1$ and $T_2$ of the cell $C_{20}$. The amplitude of the step depends in particular on the type of transistors and on the technology in which the transistors of the cell are carried out.

The following table summarizes various polarization states of the transistors $T_1$ and $T_2$ of the cell $C_{10}$ during its various operating phases.

| Phase | IN | OUT | Vcc | Vss |
| --- | --- | --- | --- | --- |
| Illumination | | | GND | GND |
| Read | $V_{IN}$ | $V_{OUT}$ | VDD | GND |
| Erase | Rising edge on $V_{IN}$ | | | |

Under illumination, the respective sources of transistors $T_1$, $T_2$ can be advantageously set by the polarization control circuit 100 to a GND ground potential in order to minimize leakage.

During the erasing phase, the polarization control circuit 100 applies an ascending step voltage on the gate of the transistors $T_1$ and $T_2$ of the cell $C_{10}$. Such a step can also be applied to the source and drain regions of transistors $T_1$, $T_2$. Such a step can also be applied on a gate of transistors $T_1$, $T_2$ arranged at the rear face and inserted between the junction and the BOX isolating layer.

Figure 11A:
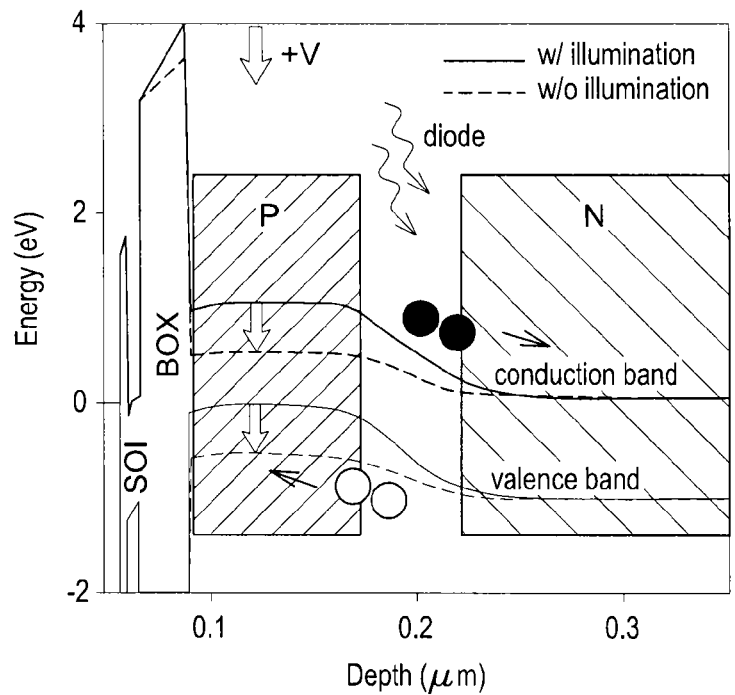
FIGS. 11A-11B show the effect of a voltage step applied on the logic cell of FIG. 10 in order to make it possible to discharge an accumulation of electrons at the interface between the BOX isolating layer.
Figure 11B:
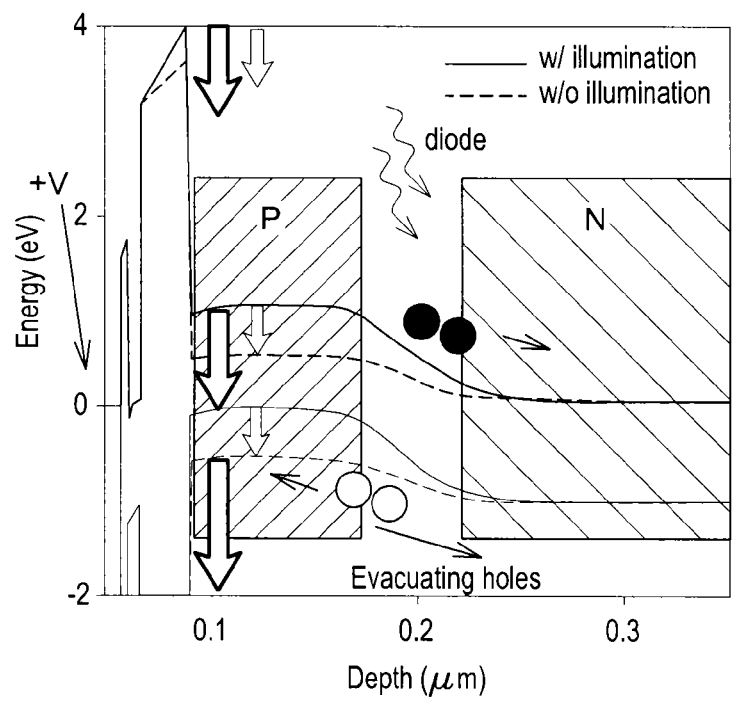

FIGS. 11A-11B make it possible to show the effect of a step voltage (FIG. 11B) on the band structure at the rear face of the cell $C_{20}$.

Figure 12:
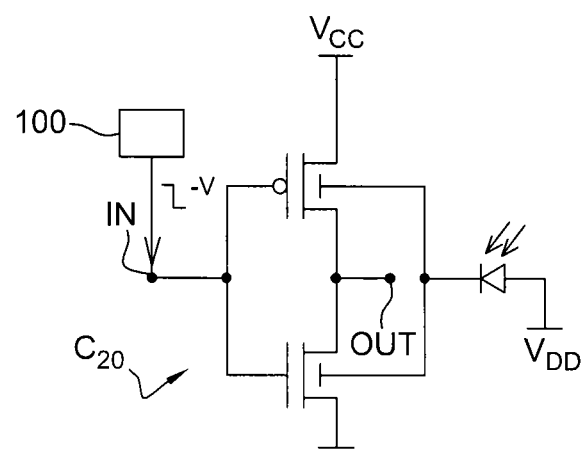
FIG. 12 shows an example means for making it possible to discharge an accumulation of holes at the interface between the BOX layer and the NP junctions of a cell of the type of that of FIG. 2A.

FIG. 12 shows an alternative embodiment adapted to a photosensitive logic cell $C_{20}$ of which the configuration is similar to that described hereinabove in liaison with FIGS. 2A and 2B, i.e. wherein the N-doped zones of the junctions are arranged on the P-doped zones and are as such inserted between the P-doped zones and the BOX isolating layer.

In this example, where the charges accumulated at the rear face under the BOX isolating layer are electrons, the step voltage emitted by the circuit 100 in order to make it possible to accelerate the discharge at the BOX/junction interface is a descending step voltage, applied to the terminal IN connected to the respective gates of the first transistor $T_1$ and of the second transistor $T_2$.

The following table summarizes the various polarization states of the transistors $T_1$ and $T_2$ of the cell $C_{20}$ during its various operating phases.

| Phase | IN | OUT | Vcc | Vss |
|---|---|---|---|---|
| Illumination | | | GND | GND |
| Read | $V_{IN}$ | $V_{OUT}$ | VDD | GND |
| Erase | Rising edge on $V_{IN}$ | | | |

Figure 13:
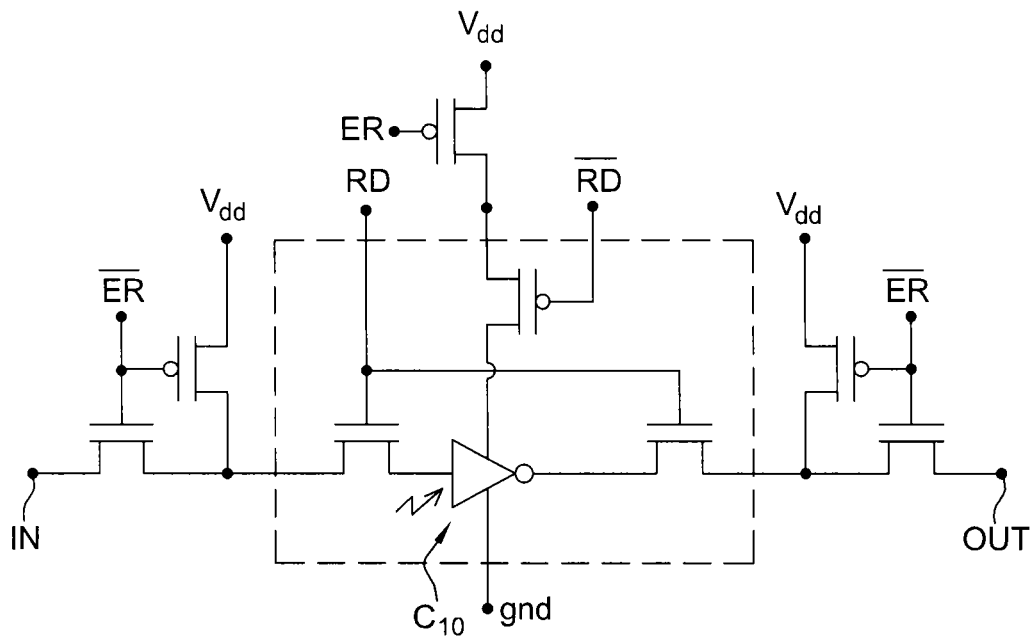
FIGS. 13 and 14 show different embodiments of a polarization control circuit adapted to put photosensitive logic cells in different polarization states and in particular in order to carry out an erasing during which a discharge of carriers accumulated at the interface between the BOX isolating layer and the junctions is implemented.
Figure 14:
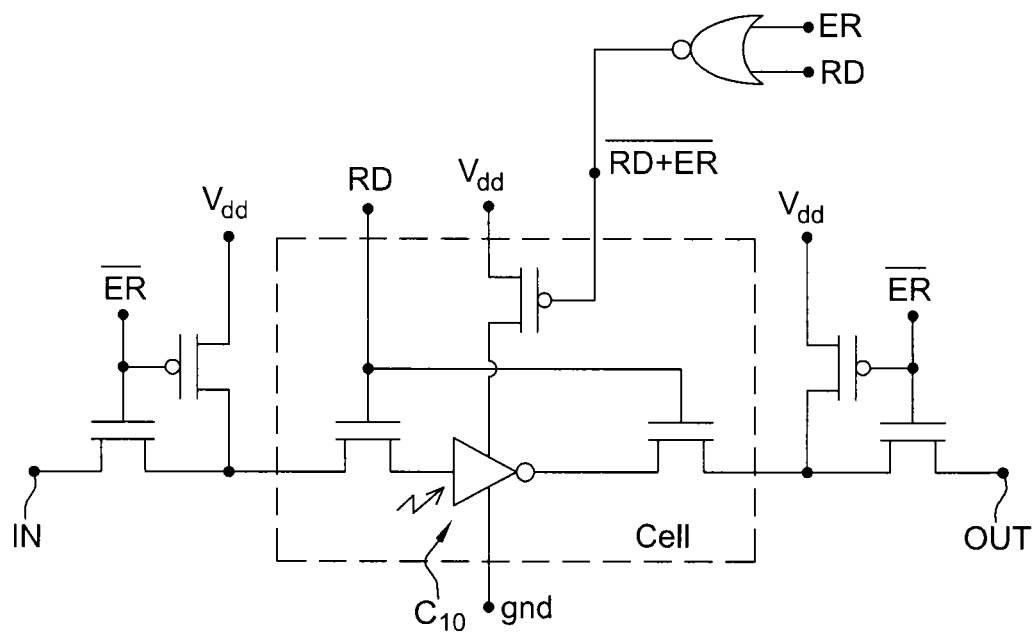

Examples of implementing a polarization control circuit using NMOS and PMOS transistors and configured to modify the polarization state of a photosensitive logic cell $C_{10}$ such as described hereinabove in liaison with FIG. 10 are given in FIGS. 13 and 14. The polarization state of the photosensitive logic cell $C_{10}$ depends on the logic state of the read RD and ER erase signals.

Such control circuits can follow the following truth table:

| ER | RD | Phase |
|---|---|---|
| 0 | 0 | Illumination |
| 0 | 1 | Read |
| Front 0→1 | 1 | Erase |

The invention claimed is:

1. Device comprising at least one photosensitive logic cell, the photosensitive logic cell comprising:
   a first transistor of the P type and a second transistor of the N type based on semiconductor substrate on insulator, with the substrate comprising a semiconductor surface area comprising a channel zone of the first transistor and a channel zone of said second transistor, an insulating layer separating the semiconductor surface area from a front face of a semiconductor support layer,
   the semiconductor support layer comprising at least a photosensitive zone configured to convert photons penetrating through a rear face of the semiconductor support layer into charge carriers and comprising a first junction arranged opposite the channel zone of said first transistor and capacitively coupled to the channel zone of the first transistor and a second junction arranged opposite the channel zone of said second transistor and capacitively coupled to the channel zone of the second transistor, such that the first transistor and the second transistor respectively have a first threshold voltage and a second threshold voltage that are modulated according to a quantity of photons received by the photosensitive zone,
   the first transistor and the second transistor being arranged in such a way as to form a logic inverter.

2. Device according to claim 1, wherein the first junction and the second junction each comprise an N-doped lower zone surmounted by a P-doped upper zone.

3. Device according to claim 2, wherein the inverter comprises an input set to a predetermined fixed polarization potential, applied to the gates of the first and of the second transistor, with the first transistor and the second transistor being polarized in such a way as to have constant respective gate-source voltages.

4. Device according to claim 2, wherein the inverter is configured to adopt at the output one of a first logic state translating a first illumination state of the photosensitive zone by a light radiation and a second logic state different from the first state and translating a second illumination state of the photosensitive zone different from the first illumination state.

5. Device according to claim 1, wherein the first junction and the second junction each comprise a P-doped lower zone surmounted by an N-doped upper zone.

6. Device according to claim 5, wherein the inverter comprises an input set to a predetermined fixed polarization potential, applied to the gates of the first and of the second transistor, with the first transistor and the second transistor being polarized in such a way as to have constant respective gate-source voltages.

7. Device according to claim 5, wherein the inverter is configured to adopt at the output one of a first logic state translating a first illumination state of the photosensitive zone by a light radiation and a second logic state different from the first state and translating a second illumination state of the photosensitive zone different from the first illumination state.

8. Device according to claim 1, wherein the first junction comprises an N-doped lower zone surmounted by a P-doped upper zone, with the second junction comprising a P-doped lower zone surmounted by an N-doped upper zone.

9. Device according to claim 8, comprising a circuit for applying a variable potential ($V_{IN}$) as input (IN) of the inverter.

10. Device according to claim 1, wherein the first junction comprises a P-doped lower zone surmounted by an N-doped upper zone, with the second junction comprising an N-doped lower zone surmounted by a P-doped upper zone.

11. Device according to claim 10, comprising a circuit for applying a variable potential ($V_{IN}$) as input (IN) of the inverter.

12. Device according to claim 8, further comprising a polarization circuit configured to apply a determined polarization potential V to the lower zone of the first junction and/or of the second junction, with the upper zone of the first junction and/or of the second junction being set to a floating potential.

13. Device according to claim 1, further comprising at least one isolating trench between the first transistor and the second transistor, with the isolating trench passing through the support layer and being configured in such a way as to electrically isolate an upper doped zone of the first junction from an upper doped zone of the second junction.

14. Device according to claim 1, further comprising at least one isolating zone around the first transistor and/or the second transistor, with the isolating zone passing through the support layer and being configured in such a way as to electrically isolate said cell from another cell or from another element formed on the substrate.

15. Device according to claim 1, further comprising at least one other transistor juxtaposed with said logic cell, a ground plane being provided in the semiconductor support layer opposite said other transistor.

16. Device according to claim 1, further comprising at least one other transistor superimposed with said logic cell.

17. Device according to claim 1 wherein the logic cell belongs to a logic circuit in order to carry out a determined logic function such as a NOT AND or NOT OR function.

18. Device according to claim 1, wherein said photosensitive logic cell belongs to a SRAM memory cell.

19. Photosensitive logic circuit creating a given logic function and provided with a device according to claim 1, with the logic function being modified according to the illumination of the device.

20. Device according to claim 1, further comprising a polarization control circuit configured to modify the polarization state of the first and second transistors and apply a step voltage to the first transistor and to the second transistor causing a discharge of regions located at the interface between the insulating layer and respectively the first and the second junction.

21. Photosensitive logic inverter comprising:
a first transistor of the P type and a second transistor of the N type, the first transistor and the second transistor being arranged on a semiconductor on insulator substrate, with the substrate comprising a semiconductor surface area comprising a channel zone of the first transistor and a channel zone of said second transistor, an insulating layer separating the semiconductor surface area from a front face of a semiconductor support layer,
the semiconductor support layer comprising at least a photosensitive zone configured to convert photons into charge carriers and comprising a first junction arranged opposite the channel zone of said first transistor and a second junction arranged opposite the channel zone of said second transistor, the photosensitive zone being capacitively coupled to the channel zone of the first transistor and being capacitively coupled to the channel zone of the second transistor such that the first transistor and the second transistor respectively have a first threshold voltage and a second threshold voltage that are modulated according to a quantity of photons received by the photosensitive zone.

* * * * *